(12) United States Patent
Schkufza et al.

(10) Patent No.: US 11,003,471 B2
(45) Date of Patent: May 11, 2021

(54) JUST-IN-TIME HARDWARE FOR FIELD PROGRAMMABLE GATE ARRAYS

(71) Applicant: VMware, Inc., Palo Alto, CA (US)

(72) Inventors: Eric Schkufza, Oakland, CA (US); Michael Wei, Palo Alto, CA (US)

(73) Assignee: VMware, Inc., Palo Alto, CA (US)

( * ) Notice: Subject to any disclaimer, the term of this patent is extended or adjusted under 35 U.S.C. 154(b) by 183 days.

(21) Appl. No.: 16/257,510

(22) Filed: Jan. 25, 2019

(65) Prior Publication Data

US 2019/0235892 A1    Aug. 1, 2019

Related U.S. Application Data

(63) Continuation-in-part of application No. 16/030,551, filed on Jul. 9, 2018, which is a continuation-in-part of application No. 15/881,654, filed on Jan. 26, 2018, now Pat. No. 10,885,247.

(60) Provisional application No. 62/715,170, filed on Aug. 6, 2018.

(51) Int. Cl.
| | |
|---|---|
| *G06F 9/455* | (2018.01) |
| *G06F 8/41* | (2018.01) |
| *G06F 30/331* | (2020.01) |

(52) U.S. Cl.
CPC ............ *G06F 9/45508* (2013.01); *G06F 8/41* (2013.01); *G06F 9/4552* (2013.01); *G06F 30/331* (2020.01)

(58) Field of Classification Search
CPC ...... G06F 9/45508; G06F 30/331; G06F 8/41; G06F 9/4552
USPC .......................................................... 703/28
See application file for complete search history.

(56) References Cited

U.S. PATENT DOCUMENTS

| | | | |
|---|---|---|---|
| 5,805,859 A | 9/1998 | Giramma et al. | |
| 5,870,587 A | 2/1999 | Danforth et al. | |
| 7,124,404 B1 | 10/2006 | Bebout et al. | |
| 8,423,975 B1 * | 4/2013 | Scallon | G06F 11/3457 717/135 |
| 2002/0023252 A1 | 2/2002 | Lee et al. | |

(Continued)

OTHER PUBLICATIONS

Altera Corporation, "AN 211 :Standard Cell ASIC to FPGA Design Methodology and Guidelines", Apr. 2009, 28 pages. (Year: 2009).

(Continued)

*Primary Examiner* — Suzanne Lo
(74) *Attorney, Agent, or Firm* — Patterson + Sheridan, LLP

(57) ABSTRACT

A system and method are disclosed for executing a component of a design in a hardware engine. The component is compiled to include an interface that supports an 'open_loop (n)' function which, when invoked, requests that the hardware engine run for a specified number of steps before communicating with other hardware or software engines via a runtime system. After the compiled hardware component is transferred to the hardware engine, the hardware engine runs for the specified number of steps unless and until it encounters a system function, such as a 'display(s)' function, in the code of the component that requires the runtime system to intervene. The hardware engine pauses awaiting the completion of the system function and continues its execution. The 'open_loop(n)' operation of the hardware engine permits components in hardware engines to run at a speed close to the native speed of the target programmable hardware fabric.

20 Claims, 27 Drawing Sheets

(56) References Cited

U.S. PATENT DOCUMENTS

| | | | |
|---|---|---|---|
| 2002/0133325 A1* | 9/2002 | Hoare, II | G06F 30/20 |
| | | | 703/17 |
| 2002/0138244 A1 | 9/2002 | Meyer | |
| 2003/0117971 A1 | 6/2003 | Aubury | |
| 2007/0219771 A1* | 9/2007 | Verheyen | G06F 30/33 |
| | | | 703/15 |
| 2015/0178426 A1* | 6/2015 | Stamness | G06F 30/33 |
| | | | 716/103 |
| 2019/0179989 A1 | 6/2019 | Emirian et al. | |
| 2019/0235893 A1 | 8/2019 | Schkufza et al. | |
| 2019/0236229 A1 | 8/2019 | Schkufza et al. | |
| 2019/0236230 A1 | 8/2019 | Schkufza et al. | |
| 2019/0236231 A1 | 8/2019 | Schkufza et al. | |

OTHER PUBLICATIONS

Bergeron et al. "Hardware JIT Compilation for Off-the-Shelf Dynamically Reconfigurable FPGAs", Mar. 2008, 16 pages. (Year: 2008).

Debian—Details of Package fpgatools. https://packages:debian:org/stretch/fpgatools. (Accessed Jul. 2018).

FPGAMiner. https://github:com/fpgaminer/Open-Source-FPGA-Bitcoin-Miner. (Accessed Jul. 2018).

SymbiFlow. https://symbiflow:github:io/. (Accessed Jul. 2018).

Ieee standard vhdl language reference manual. IEEE Std 1076-2008 (Revision of IEEE Std 1076-2002), pp. c1-c626, Jan. 2009.

Avalon interface specifications, 2017.

Device handbook—altera cyclone v, 2017.

Intel unveils new Xeon chip with integrated FPGA, touts 20x performance boost—ExtremeTech, 2017.

K Aehlig et al. Bazel: Correct, reproducible, fast builds for everyone, 2016.

Joshua Auerbach, David F. Bacon, Perry Cheng, and Rodric Rabbah. Lime: A java-compatible and synthesizable language for heterogeneous architectures. In Proceedings of the ACM International Conference on Object Oriented Programming Systems Languages and Applications, OOPSLA '10, pp. 89-108, New York, NY, USA, 2010. ACM.

Jonathan Bachrach, Huy Vo, Brian C. Richards, Yunsup Lee, Andrew Waterman, Rimas Avizienis, John Wawrzynek, and Krste Asanovic. Chisel: constructing hardware in a scala embedded language. In the 49th Annual Design Automation Conference 2012, DAC '12, San Francisco, CA, USA, Jun. 3-7, 2012, pp. 1216-1225, 2012.

Stuart Byma, Naif Tarafdar, Talia Xu, Hadi Bannazadeh, Alberto Leon-Garcia, and Paul Chow. Expanding openflow capabilities with virtualized reconfigurable hardware. In Proceedings of the 2015 ACM/SIGDA International Symposium on Field-Programmable Gate Arrays, FPGA '15, pp. 94-97, New York, NY, USA, 2015. ACM.

Jared Casper and Kunle Olukotun. Hardware acceleration of database operations. In Proceedings of the 2014 ACM/SIGDA International Symposium on Field-programmable Gate Arrays, FPGA '14, pp. 151-160, New York, NY, USA, 2014. ACM.

Adrian Caulfield, Eric Chung, Andrew Putnam, Hari Angepat, Jeremy Fowers, Michael Haselman, Stephen Heil, Matt Humphrey, Puneet Kaur, Joo-Young Kim, Daniel Lo, Todd Massengill, Kalin Ovtcharov, Michael Papamichael, Lisa Woods, Sitaram Lanka, Derek Chiou, and Doug Burger. A cloud-scale acceleration architecture. In Proceedings of the 49th Annual IEEE/ACM International Symposium on Microarchitecture. IEEE Computer Society, Oct. 2016.

Liang Chen, Thomas Marconi, and Tulika Mitra. Online scheduling for multi-core shared reconfigurable fabric. In Proceedings of the Conference on Design, Automation and Test in Europe, DATE '12, pp. 582-585, San Jose, CA, USA, 2012. EDA Consortium.

Eric S. Chung, John D. Davis, and Jaewon Lee. Linqits: Big data on little clients. In 40th International Symposium on Computer Architecture. ACM, Jun. 2013.

Guohao Dai, Yuze Chi, Yu Wang, and Huazhong Yang. Fpgp: Graph processing framework on fpga a case study of breadth-first search. In Proceedings of the 2016 ACM/SIGDA International Symposium on Field-Programmable Gate Arrays, FPGA '16, pp. 105-110, New York, NY, USA, 2016. ACM.

Amazon EC2. Amazon ec2 f1 instances, 2017.

Hamed Esfahani, Jonas Fietz, Qi Ke, Alexei Kolomiets, Erica Lan, Erik Mavrinac, Wolfram Schulte, Newton Sanches, and Srikanth Kandula. Cloudbuild: Microsoft's distributed and caching build service. In Proceedings of the 38th International Conference on Software Engineering, ICSE 2016, Austin, TX, USA, May 14-22, 2016—Companion Volume, pp. 11-20, 2016.

GNU. Gtkwave. http://gtkwave:sourceforge:net. (Accessed Jul. 2018).

Arria V Device Handbook. vol. 1: Device overview and datasheet. 2012.

Intel. Intel quartus prime software, 2018.

Zsolt István, David Sidler, and Gustavo Alonso. Caribou: Intelligent distributed storage. PVLDB, 10(11):1202-1213, 2017.

Zsolt István, David Sidler, Gustavo Alonso, and Marko Vukolic. Consensus in a box: Inexpensive coordination in hardware. In Proceedings of the 13th Usenix Conference on Networked Systems Design and Implementation, NSDI'16, pp. 425-438, Berkeley, CA, USA, 2016. USENIX Association.

H. Kalte and M. Porrmann. Context saving and restoring for multitasking in reconfigurable systems. In Field Programmable Logic and Applications, 2005. International Conference on, pp. 223-228, Aug. 2005.

Rüdiger Kapitza, Johannes Behl, Christian Cachin, Tobias Distler, Simon Kuhnle, Seyed Vahid Mohammadi, Wolfgang Schröder-Preikschat, and Klaus Stengel. Cheapbft: Resource-efficient byzantine fault tolerance. In Proceedings of the 7th ACM European Conference on Computer Systems, EuroSys '12, pp. 295-308, New York, NY, USA, 2012. ACM.

Kaan Kara and Gustavo Alonso. Fast and robust hashing for database operators. In 26th International Conference on Field Programmable Logic and Applications, FPL 2016, Lausanne, Switzerland, Aug. 29-Sep. 2, 2016, pp. 1-4, 2016.

Ahmed Khawaja, Joshua Landgraf, Rohith Prakash, Michael Wei, Eric Schkufza, and Christopher Rossbach. Sharing, protection and compatibility for reconfigurable fabric with amorphos. To Appear in OSDI, 2018.

Khronos Group. The OpenCL Specification, Version 1.0, 2009.

Avi Kivity, Yaniv Kamay, Dor Laor, Uri Lublin, and Anthony Liguori. kvm: the linux virtual machine monitor. In Proceedings of the Linux symposium, vol. 1, pp. 225-230, 2007.

Ilia A. Lebedev, Christopher W. Fletcher, Shaoyi Cheng, James Martin, Austin Doupnik, Daniel Burke, Mingjie Lin, and John Wawrzynek. Exploring many-core design templates for fpgas and asics. Int. J. Reconfig. Comp., 2012:439141:1-439141:15, 2012.

Christian Leber, Benjamin Geib, and Heiner Litz. High frequency trading acceleration using fpgas. In Proceedings of the 2011 21st International Conference on Field Programmable Logic and Applications, FPL '11, pp. 317-322, Washington, DC, USA, 2011. IEEE Computer Society.

Trong-Yen Lee, Che-Cheng Hu, Li-Wen Lai, and Chia-Chun Tsai. Hardware context-switch methodology for dynamically partially reconfigurable systems. J. Inf. Sci. Eng., 26:1289-1305, 2010.

L. Levinson, R. Manner, M. Sessler, and H. Simmler. Preemptive multitasking on fpgas. In Field-Programmable Custom Computing Machines, 2000 IEEE Symposium on, pp. 301-302, 2000.

Sheng Li, Hyeontaek Lim, Victor W. Lee, Jung Ho Ahn, Anuj Kalia, Michael Kaminsky, David G. Andersen, O. Seongil, Sukhan Lee, and Pradeep Dubey. Architecting to achieve a billion requests per second throughput on a single key-value store server platform. In Proceedings of the 42Nd Annual International Symposium on Computer Architecture, ISCA '15, pp. 476-488, New York, NY, USA, 2015. ACM.

Enno Lübbers and Marco Platzner. Reconos: Multithreaded programming for reconfigurable computers. ACM Trans. Embed. Comput. Syst., 9(1):8:1-8:33, Oct. 2009.

Microsoft. Microsoft azure goes back to rack servers with project olympus, 2017.

(56) References Cited

OTHER PUBLICATIONS

Mahim Mishra, Timothy J. Callahan, Tiberiu Chelcea, Girish Venkataramani, Seth C. Goldstein, and Mihai Budiu. Tartan: Evaluating spatial computation for whole program execution. SIGOPS Oper. Syst. Rev., 40(5):163-174, Oct. 2006.
Nicholas Moore, Albert Conti, Miriam Leeser, Benjamin Cordes, and Laurie Smith King. An extensible framework for application portability between reconfigurable supercomputing architectures, 2007.
Tayo Oguntebi and Kunle Olukotun. Graphops: A dataflow library for graph analytics acceleration. In Proceedings of the 2016 ACM/SIGDA International Symposium on Field-Programmable Gate Arrays, FPGA '16, pp. 111-117, New York, NY, USA, 2016. ACM.
K. Dang Pham, A. K. Jain, J. Cui, S. A. Fahmy, and D. L. Maskell. Microkernel hypervisor for a hybrid arm-fpga platform. In Application-Specific Systems, Architectures and Processors (ASAP), 2013 IEEE 24th International Conference on, pp. 219-226, Jun. 2013.
Christian Plessl and Marco Platzner. Zippy—a coarse-grained reconfigurable array with support for hardware virtualization. In Application-Specific Systems, Architecture Processors, 2005. ASAP 2005. 16th IEEE International Conference on, pp. 213-218. IEEE, 2005.
M Pool et al. distcc: A free distributed c/c++ compiler system, 2016.
Andrew Putnam, Adrian Caulfield, Eric Chung, Derek Chiou, Kypros Constantinides, John Demme, Hadi Esmaeilzadeh, Jeremy Fowers, Gopi Prashanth Gopal, Jan Gray, Michael Haselman, Scott Hauck, Stephen Heil, Amir Hormati, Joo-Young Kim, Sitaram Lanka, Jim Laws, Eric Peterson, Simon Pope, Aaron Smith, Jason Thong, Phillip Yi Xiao, and Doug Burger. A reconfigurable fabric for accelerating large-scale datacenter services. In 41st Annual International Symposium on Computer Architecture (ISCA), Jun. 2014.
Kyle Rupnow, Wenyin Fu, and Katherine Compton. Block, drop or roll(back): Alternative preemption methods for RH multi-tasking. In FCCM 2009, 17th IEEE Symposium on Field Programmable Custom Computing Machines, Napa, California, USA, Apr. 5-7, 2009, Proceedings, pp. 63-70, 2009.
J. Russell and R. Cohn. Icarus Verilog. Book on Demand, 2012.
Omar Sefraoui, Mohammed Aissaoui, and Mohsine Eleuldj. Openstack: toward an open-source solution for cloud computing. International Journal of Computer Applications, 55(3), 2012.
Yi Shan, Bo Wang, Jing Yan, Yu Wang, Ning-Yi Xu, and Huazhong Yang. Fpmr: Mapreduce framework on fpga. In Peter Y. K. Cheung and John Wawrzynek, editors, FPGA, pp. 93-102. ACM, 2010.
W Snyder, D Galbi, and P Wasson. Verilator, 2018.
Hayden Kwok-Hay So and Robert Brodersen. A unified hardware/software runtime environment for fpga-based reconfigurable computers using borph. ACM Trans. Embed. Comput. Syst., 7(2):14:1-14:28, Jan. 2008.
Hayden Kwok-Hay So and Robert W. Brodersen. BORPH: An Operating System for FPGA-Based Reconfigurable Computers. PhD thesis, EECS Department, University of California, Berkeley, Jul. 2007.
Hayden Kwok-Hay So and John Wawrzynek. Olaf'16: Second international workshop on overlay architectures for fpgas. In Proceedings of the 2016 ACM/SIGDA International Symposium on Field-Programmable Gate Arrays, FPGA '16, pp. 1-1, New York, NY, USA, 2016. ACM.
C. Steiger, H. Walder, and M. Platzner. Operating systems for reconfigurable embedded platforms: online scheduling of real-time tasks.
Naveen Suda, Vikas Chandra, Ganesh Dasika, Abinash Mohanty, Yufei Ma, Sarma Vrudhula, Jae-sun Seo, and Yu Cao. Throughput-optimized opencl-based fpga accelerator for large-scale convolutional neural networks. In Proceedings of the 2016 ACM/SIGDA International Symposium on Field-Programmable Gate Arrays, FPGA '16, pp. 16-25, New York, NY, USA, 2016. ACM.
Clifford Wolf, Yosys open synthesis suite http:// www:clifford:at/yosys/ (Accessed Jul. 2018).
Chen Zhang, Peng Li, Guangyu Sun, Yijin Guan, Bingjun Xiao, and Jason Cong. Optimizing fpga-based accelerator design for deep convolutional neural networks. In Proceedings of the 2015 ACM/SIGDA International Symposium on Field-Programmable Gate Arrays, FPGA '15, pp. 161-170, New York, NY, USA, 2015. ACM.
Bhaktavachalu, Ramesh et al., Design of AXI bus interface modules on FPGA, 2016 National Conference on Advanced Communication Control and Computing Technologies, pp. 141-146, 2016.
IEEE Standard for Verilog Hardware Description Language. IEEE Std 1364-2005 (Revision of IEEE Std 1364-2001), pp. 1-560, 2006, Abstract only.
Brebner, Gordon, A Virtual Hardware Operating System for the Xilinx XC6200. In Proceedings of the 6th International Workshop on Field-Programmable Logic, Smart Applications, New Paradigms and Compilers, FPL '96, London, UK, 1996, Abstract only.
Chen, Fei et al., Enabling FPGAS in the Cloud, In Proceedings of the 11th ACM Conference on Computing Frontiers, CF '14, pp. 3:1-3:10, New York, NY, USA, 2014. ACM.
Coussy, Philippe et al., High-Level Synthesis: from Algorithm to Digital Circuit. Springer Science + Business Media B.V., 2008.
Crockett, Louise H. et al., The Zynq Book: Embedded Processing Withe ARM Cortex-A9 on the Xilinx Zynq-7000 All Programmable SoC, Strathclyde Academic Media, 2014, Abstract only.
Dehon, André et al., Stream computations organized for reconfigurable execution, Microprocessors and Microsystems, 30(6): 334-354, 2006.
Fu, Wenyin et al., Scheduling Intervals for Reconfigurable Computing, 2008 16th International Symposium on Field-Programmable Custom Computing Machines, Palo Alto, CA, 2008, pp. doi: 10.1109/FCCM.2008.48, Abstract only.
Gonzalez, Ivan et al., Virtualization of reconfigurable coprocessors in HPRC systems with multicore architecture, Journal of Systems Architecture, 58(6-7), pp. Jun. 2012, Abstract only.
Hamilton, Brandon Kyle et al., Scheduling Mixed Architecture Processes in Tightly Coupled FPGA-CPU Reconfigurable Computers, In Field-Programmable Custom Computing Machines (FCCM), 2014 IEEE 22nd Annual International Symposium on, pp. 240-240, May 2014, Abstract only.
Heydon, Allan et al., Software Configuration Management Using Vesta, Monographs in Computer Science, Springer, 2006, Abstract only.
Kirchgessner, Robert et al., Low-Overhead FPGA Middleware for Application Portability and Productivity, ACM Transactions on Reconfigurable Technology and Systems, 8(4): Sep. 2015, Abstract only.
Kirchgessner, Robert et al., VirtualRC: A Virtual FPGA Platform for Applications and Tools Portability, In Proceedings of the ACM/SIGDA International Symposium on Field Programmable Gate Arrays, FPGA '12, pp. 205-208, New York, NY, USA, 2012. ACM.
Song, Haoyu et al., Snort Offloader: A Reconfigurable Hardware NIDS Filter, In Proceedings of the 2005 International Conference on Field Programmable Logic and Applications (FPL), Tampere, Finland, Aug. 24-26, 2005, pp. 493-498, 2005.
Tsutsui, A. et al., Special purpose FPGA for high-speed digital telecommunication systems, In Proceedings of the 1995 International Conference on Computer Design: VLSI in Computers and Processors, ICCD '95, pp. Washington, DC, USA, 1995. IEEE Computer Society, Abstract only.
Wassi, Guy et al., Multi-shape tasks scheduling for online multitasking on FPGAs, In Reconfigurable and Communication-Centric Systems-on-Chip (ReCoSoC), 2014 9th International Symposium on, pp. May 2014, Abstract only.

\* cited by examiner

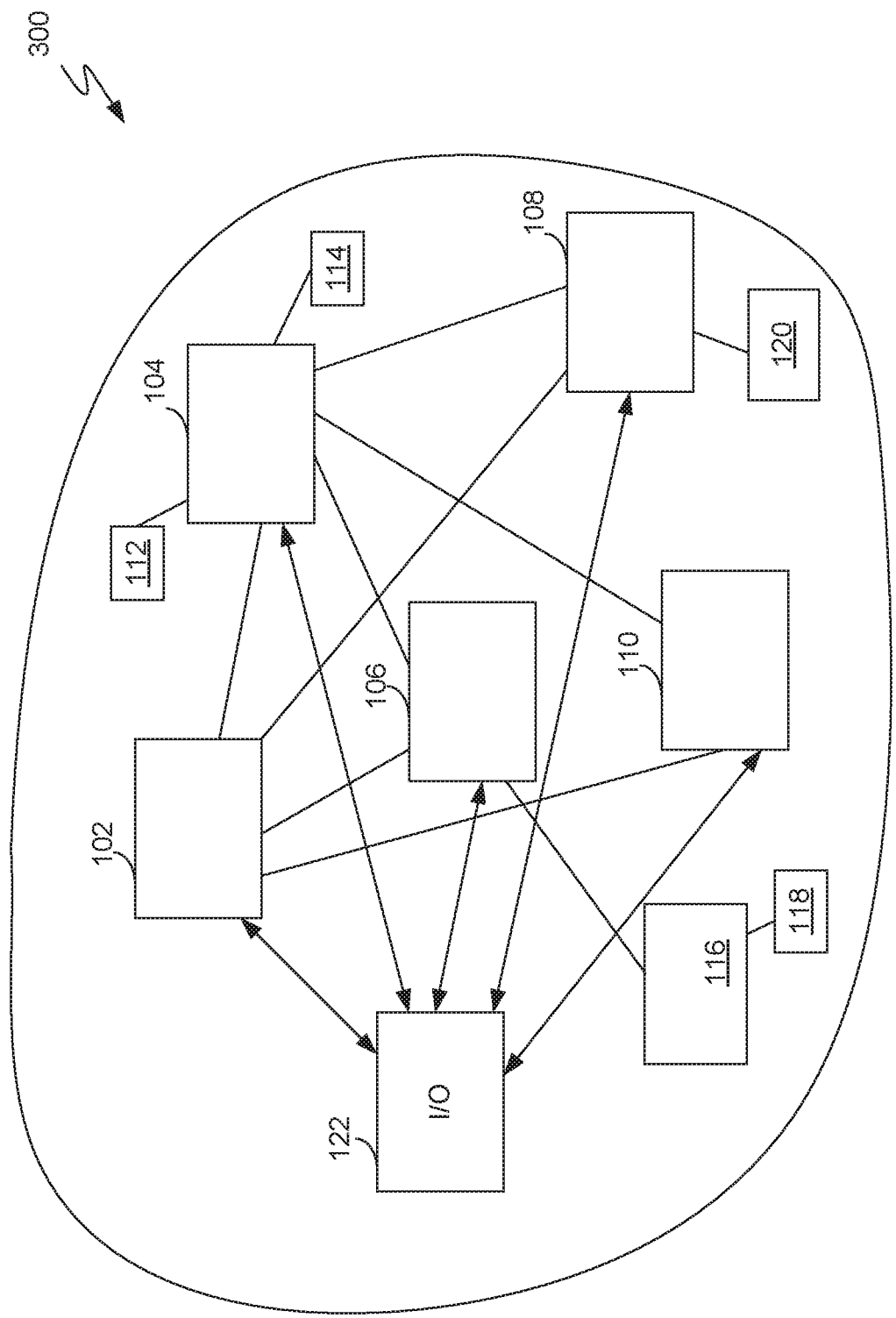

JUST-IN-TIME HARDWARE FOR FIELD PROGRAMMABLE GATE ARRAYS

CROSS-REFERENCE TO RELATED APPLICATION(S)

This application is a continuation-in-part of U.S. application Ser. No. 16/030,551, filed on Jul. 9, 2018, which is a continuation-in-part application of U.S. application Ser. No. 15/881,654, filed Jan. 26, 2018. This application further claims the benefit of U.S. Provisional Application 62/715,170, filed Aug. 6, 2018. The contents of each of these applications are hereby expressly incorporated by reference in their entirety.

BACKGROUND

As the semiconductor industry makes improvements in the size of a transistor, the number of transistors available on a semiconductor device of a given die area increases. However, the improved transistor density of the semiconductor device encounters a problem. As the transistor density increases, the device consumes more power and ultimately exceeds safe thermal limits for the given die area. Because the power consumed by the die is a direct function of clock speed, the power limit acts as a barrier that constrains the maximum clock speed and computing performance available from a single-threaded, general purpose processor. In response to this power barrier, processor architectures have incorporated parallelism in the form of multiple core processors. However, the power consumption problem remains even with multi-core processors, regardless of the multi-core architecture. In addition, the degree of parallelism achievable by multi-core architectures is limited, and this limitation along with the power barrier becomes a significant source of "dark silicon," i.e., unpowered silicon. In one study, the speedup of the system increased only by about a factor of eight although improved transistor density offered a potential performance increase by a factor of more than 32.

Clearly, the performance that is potentially available from improved transistor technology is not being realized by today's processing architectures. To extract more performance, alternatives to current processing architectures are needed. One alternative is the use of field programmable gate arrays (FPGAs). The performance of FPGA-implemented tasks or functions can easily exceed the performance of a general purpose processor by several orders of magnitude. However, design of an FPGA is a difficult and lengthy process. The process involves writing a design in a hardware description language (HDL), such as Verilog or VHDL, simulating the design, synthesizing the HDL design to a register transfer language (RTL), and then placing and routing the design for a specific type of FPGA. This process can take hours or even days. In addition, if and when the design is loaded onto the FPGA and the result does not function as expected or has an error, the entire process must be repeated to find the error.

This design flow impedes the adoption of FPGA designs because the debug cycle is too long and the design is targeted to a specific type of FPGA. The long design cycles make the use of different FPGAs difficult and almost rules out optimizing the design, as the optimization would take even more design cycles. Therefore, an improved design process, including an improved simulation process, is desirable to make FPGA development easier.

SUMMARY

One embodiment is a method for executing a hardware component of a design that includes a plurality of components executable in a plurality of software or hardware engines. The method includes compiling the hardware component to run in an available hardware engine, where compiling includes adding code to support an 'open_loop (n)' function and where invoking the 'open_loop(n)' function requests that the hardware engine execute a number of steps before the hardware component communicates with a component in a different hardware or software engine, transferring the compiled hardware component to the available hardware engine for execution under the control of a scheduler, and then invoking the 'open_loop(n)' function of the transferred component.

Further embodiments of the present invention include a non-transitory computer-readable storage medium comprising instructions that cause a computer system to carry out one or more aspects of the above method, and a computer system configured to carry out one or more aspects of the above method.

An advantage of the system and method for executing a hardware component is that the portion of the design in the hardware engines can execute at a speed that is close to native speeds of the target programmable hardware fabric.

BRIEF DESCRIPTION OF THE DRAWINGS

FIG. 3 depicts a physical distributed system that implements the hierarchical set of functional modules in the design of FIG. 2.

DETAILED DESCRIPTION

Embodiments disclosed herein include a process which combines a runtime system, along with one or more software engines and one or more hardware engines to create just-in-time hardware for FPGAs. As used herein, a runtime system is a software environment that contains a collection of procedures such as software modules and functions, input and output functions, and interfaces therebetween that cooperate to support the running of the modules and functions.

Figure 1:
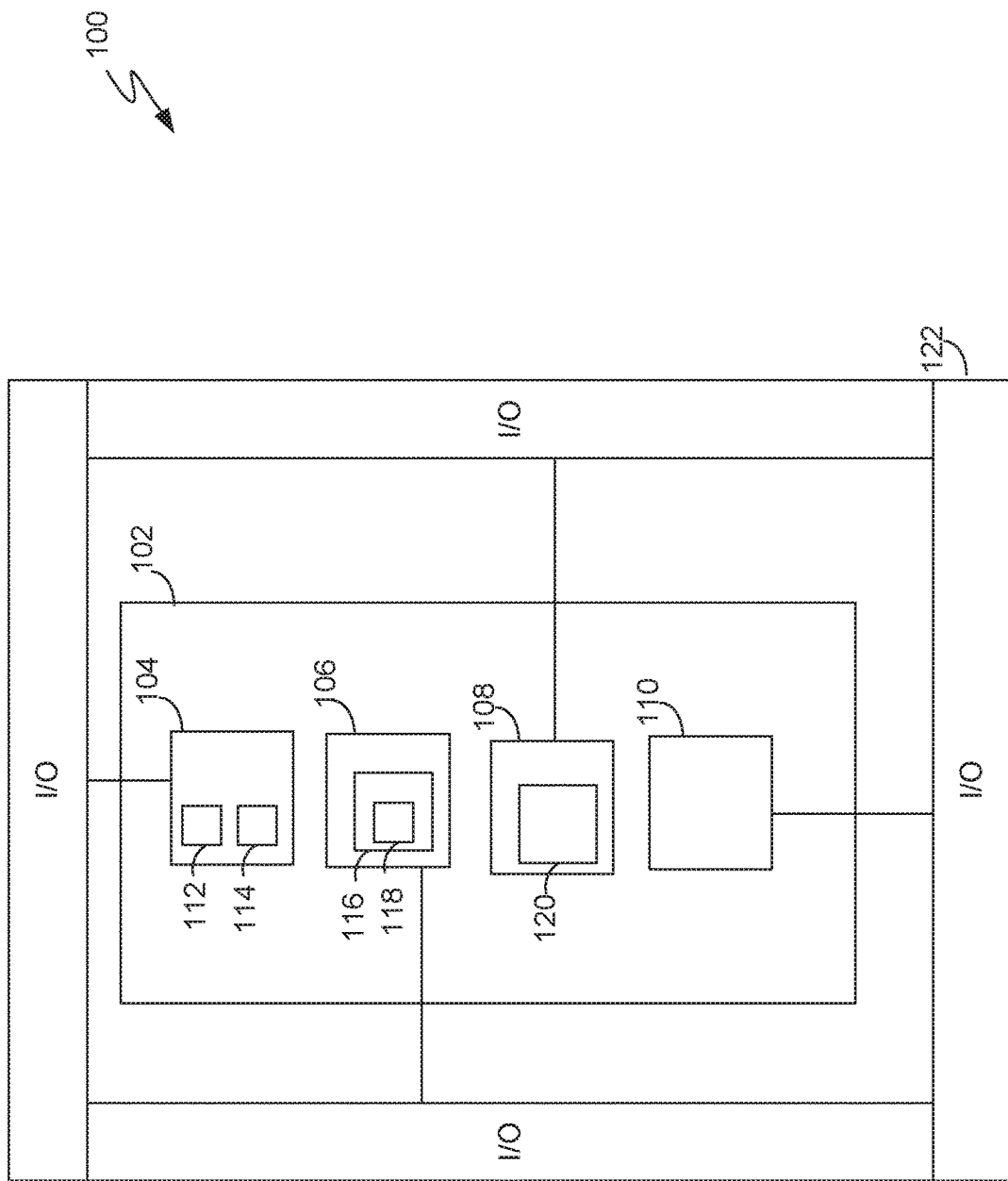
FIG. 1 depicts a design of a number of functional modules to be loaded and executed on hardware such as an FPGA.

FIG. 1 depicts a design 100 of a number of functional modules 102, 104, 106, 108, 110, 122 to be loaded and executed on hardware such as an FPGA. In FIG. 1, each of the functional modules 102, 104, 106, 108, 110, 122 can be independent or can include sub-modules, thus creating a hierarchy of modules. For example, module 104 includes two sub-modules 112 and 114, while module 106 includes sub-module 116 which further includes sub-module 118. Module 108 includes sub-module 120 and module 110 has no sub-modules. In addition, each of the functional modules 104, 106, 108, 110 has access to IO module 122 so that the module can communicate with items external to the functional modules, such as buttons, switches, lights, transducers and the like.

Figure 2:
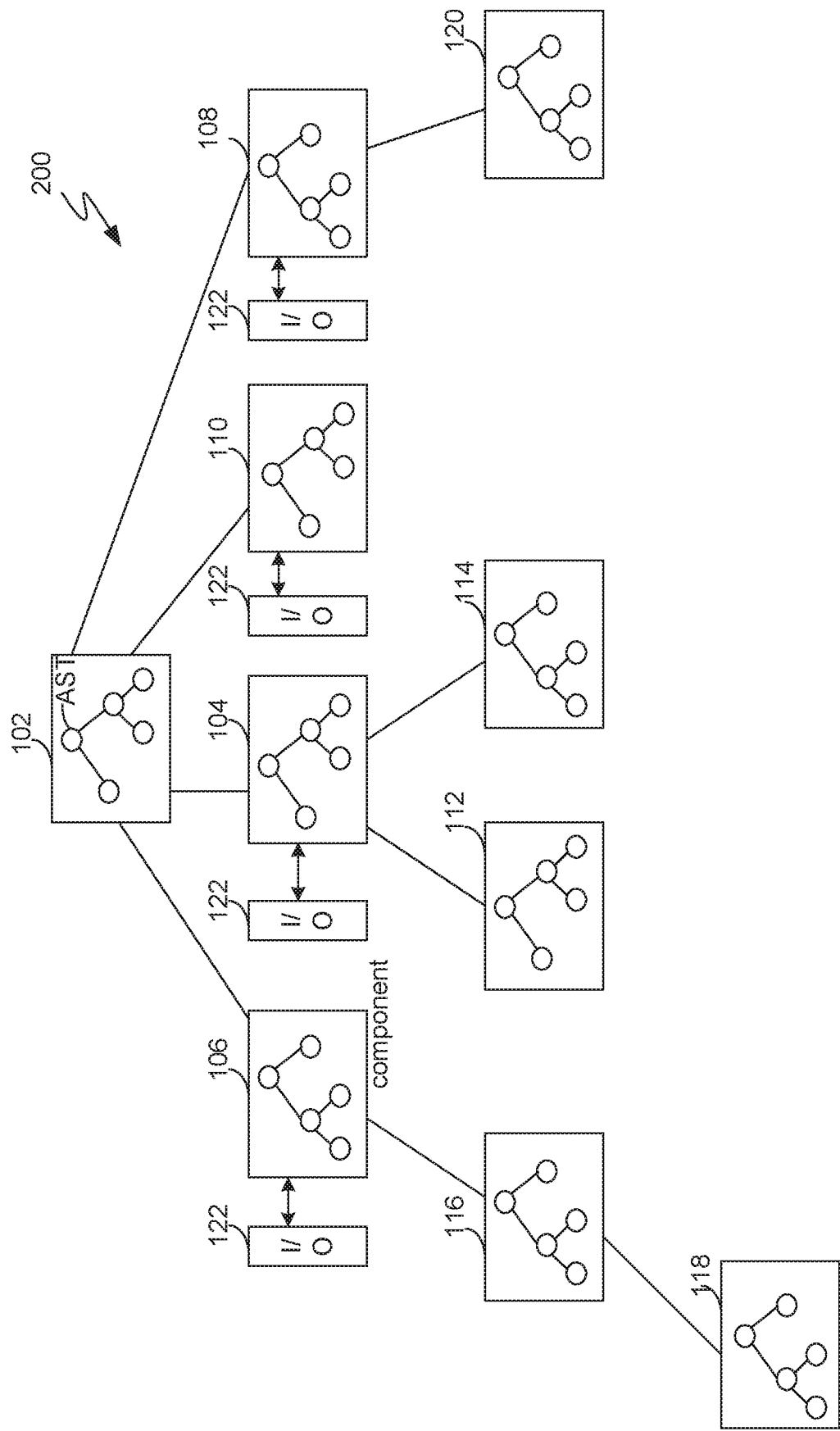
FIG. 2 depicts a parsing of the design in FIG. 1 to capture the hierarchy of functional modules in the design.

FIG. 2 depicts a parsing 200 of design 100 in FIG. 1 to capture the hierarchy of functional modules in the design. The root module in the hierarchy is module 102, which has sub-modules 104, 106, 108, 110, 116 and leaves 118, 112, 114, 120. In addition, each of the sub-modules is parsed into an abstract syntax tree to represent the design of the sub-module.

FIG. 3 depicts a physical distributed system 300 that implements the hierarchical set of functional modules 102, 104, 106, 108, 110, 112, 114, 116, 118, 120 in the design of FIG. 2. Thus, the design of FIG. 2 is realized in hardware as a distributed system comprising a set of components 102, 104, 106, 108, 110, 112, 114, 116, 118, 120, each of which communicates with one or more other components. In an embodiment, IO module 122 can be a component from a standard library.

Figure 4A:
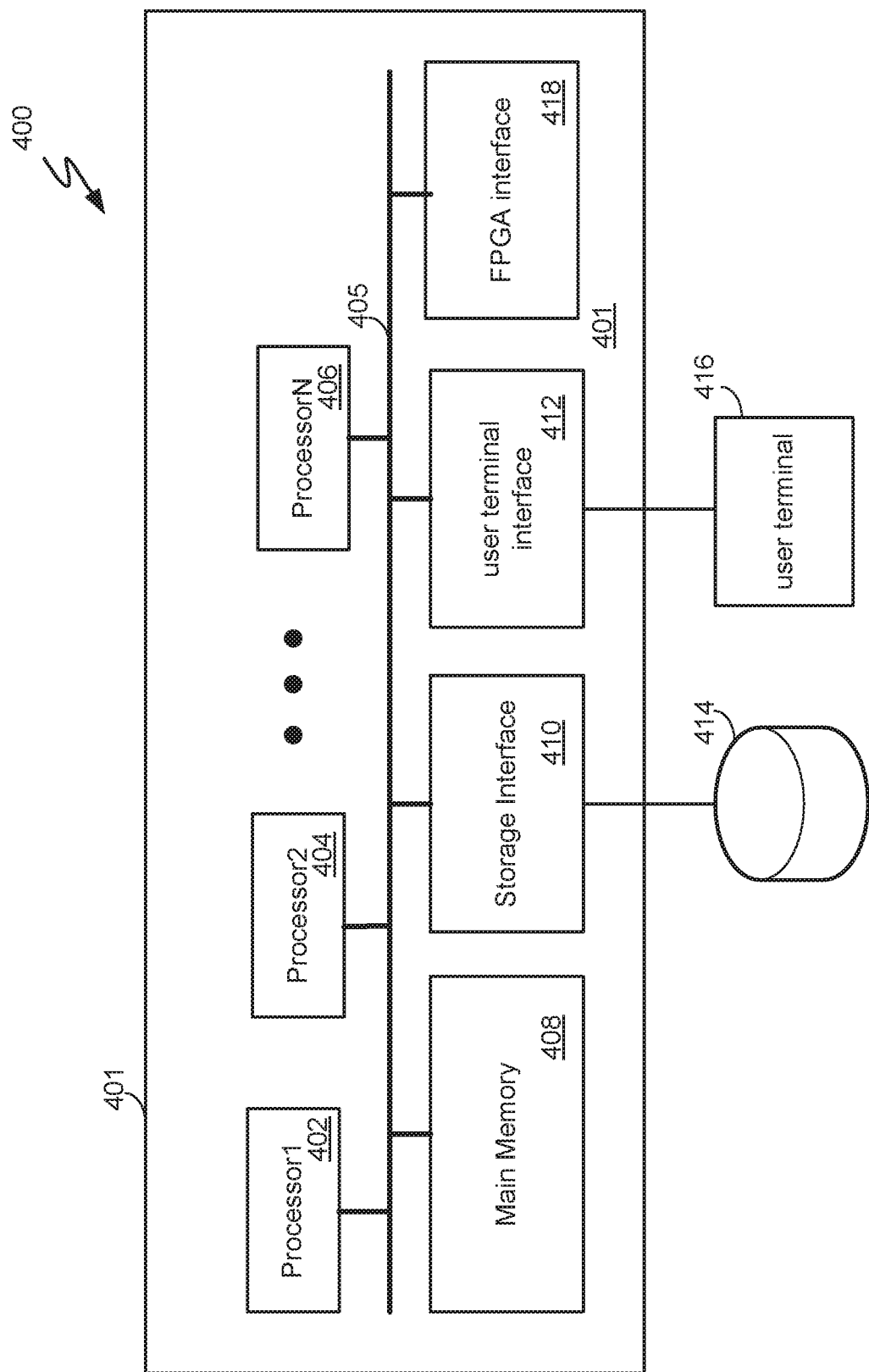
FIG. 4A depicts a system in which embodiments described herein may be practiced.

FIG. 4A depicts a system 400 in which embodiments described herein may be practiced. System 400 includes a computer system 401 having one or more general or special purpose processors 402, 404, 406 coupled to which are a bus 405, main memory 408, a storage interface 410 that connects to storage 414, a user terminal interface 412 that connects to a user terminal 416 and an FPGA interface 418 for connecting to one or more FPGAs (e.g., a bank of FPGAs).

Figure 4B:
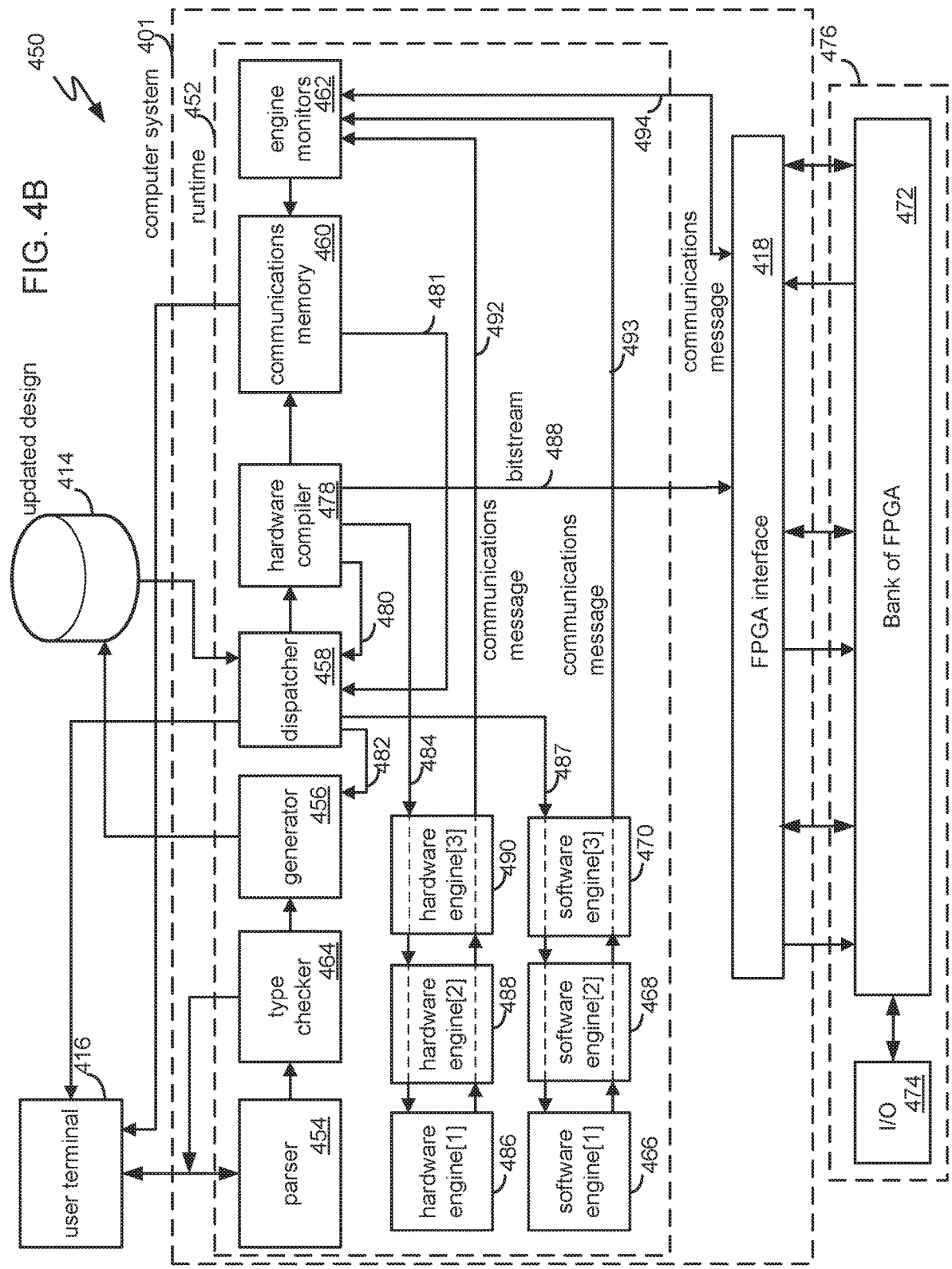
FIG. 4B depicts processing modules in a system used to develop and implement the design of FIG. 1 in one embodiment.

FIG. 4B depicts processing modules in a system 450 used to develop and implement the design of FIG. 1 in one embodiment. System 450 includes a computer system 401, such as the one described in FIG. 4A. Computer system 401 includes an FPGA interface 418 which connects to a bank 472 of FPGAs, which in turn is coupled to I/O 474. Also connected to computer system 401 are a user output interface device, such as user terminal 416, and storage 414. In computer system 401, main memory 408 includes instructions, which when processed by one or more processors 402, 404, 406 execute a runtime system 452. Runtime system 452 includes a parser 454, a type checker 464, a generator 456, a dispatcher 458, a hardware compiler 478, a communications memory 460, engine monitors 462, one or more hardware engines 486, 488, 490 and one or more software engines 466, 468, 470.

Parser 454, type checker 464 and generator 456 are configured to receive user input from user terminal 416 or a request from dispatcher 458 and to generate and store a representation of a hardware design to be loaded into bank 472 of FPGAs.

Dispatcher 458, hardware compiler 478, communications memory 460, engine monitors 462, hardware engines 486, 488, 490 and software engines 466, 468, 470 are configured to execute and simulate a hardware design to be loaded into bank 472 of FPGAs. In particular, hardware compiler 478 places and routes the design, performs timing checks on the design and checks regarding the target FPGA into which the design is to be loaded. Each of the hardware engines 486, 488, 490 is configured to execute the placed and routed design of a component of the design. Each of the software engines 466, 468, 470 is configured to simulate a software version (HDL) of a component of the design. Communications memory 460 permits software engines 466, 468, 470, hardware engines 486, 488, 490, and FPGAs in bank 472 of FPGAs to communicate with each other by receiving messages from engine monitors 462.

Figure 5A:
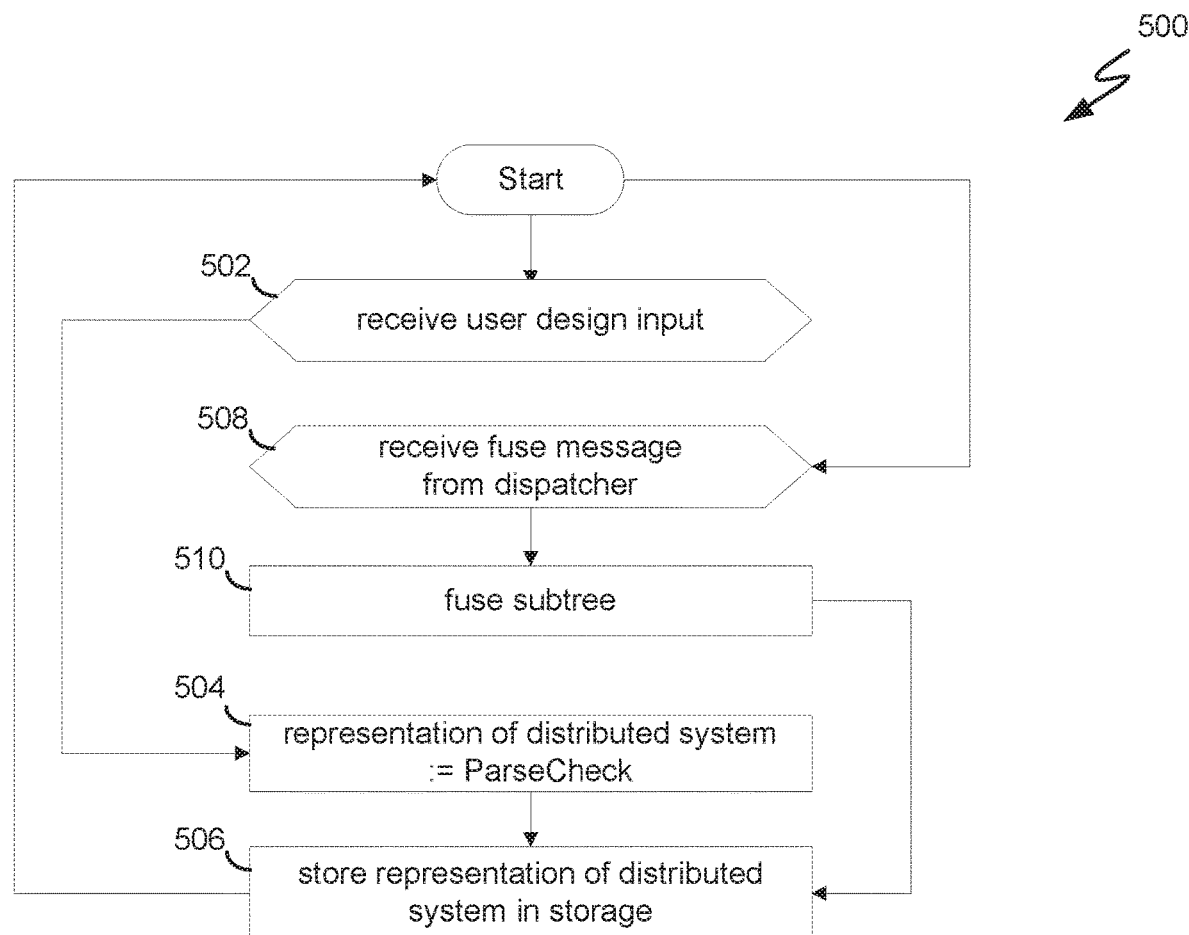
FIG. 5A depicts a flowchart of operations for processing a design change in one embodiment.

FIG. 5A depicts a flowchart of operations for processing a design change in one embodiment. In step 502, upon receiving design input from the user, runtime system 452 calls a function, ParseCheck 550, in step 504, which is further described in reference to FIG. 5B and in step 506 stores a representation of distributed system 300 in FIG. 3 in storage 414. Alternatively, upon receiving in step 508 a request to inline a sub-tree of the design in step 510 as depicted in FIG. 2 from dispatcher 458, runtime system 452 stores in step 506 the updated representation of distributed system 300 in storage 414. The fusing of sub-trees is discussed further below.

Figure 5B:
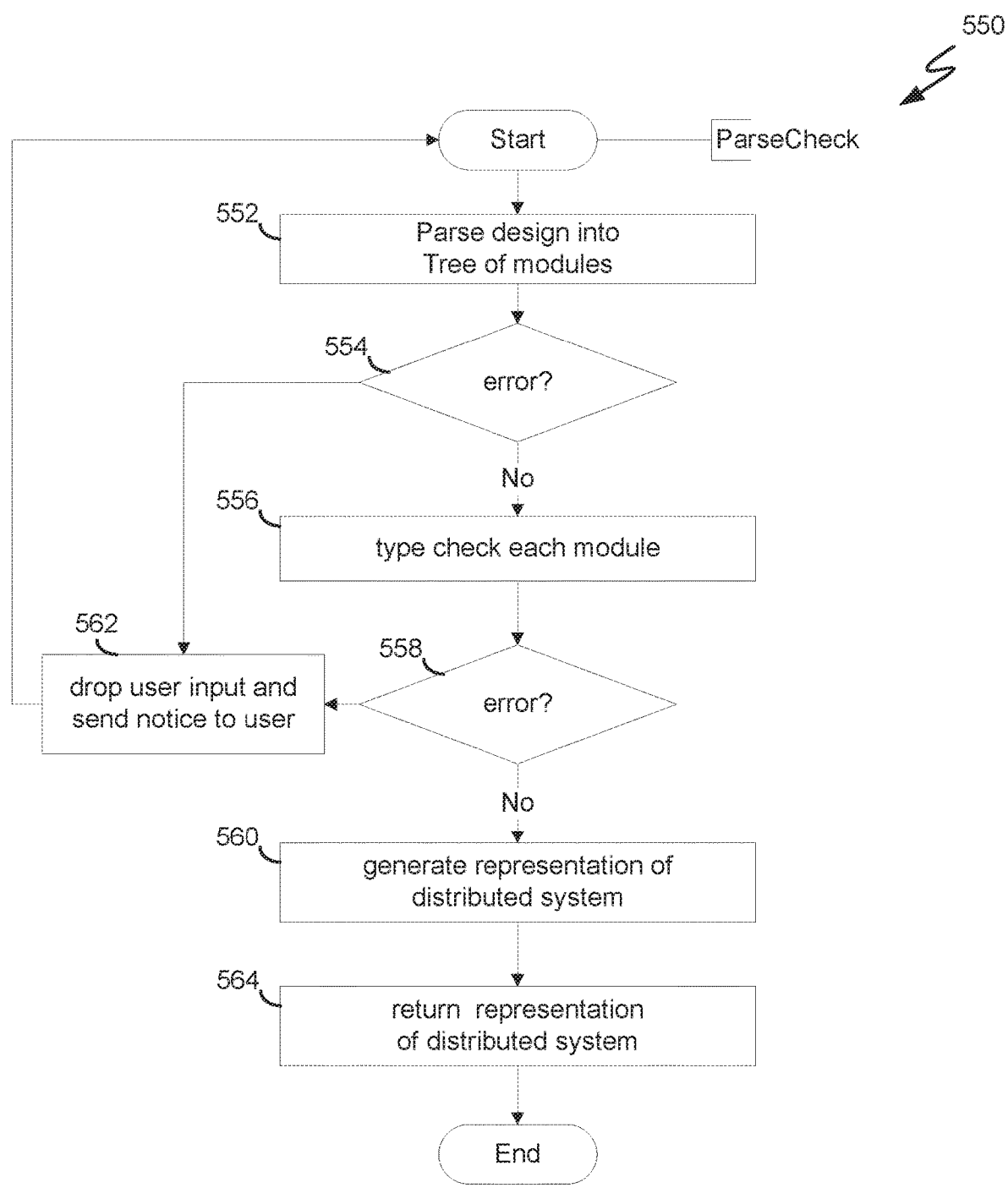
FIG. 5B depicts a flowchart of operations performed by the ParseCheck function in one embodiment.

FIG. 5B depicts a flowchart of operations performed by ParseCheck function 550 in one embodiment. Upon function 550 being called in FIG. 5A, parser 454 parses the design of FIG. 1 in step 552 into the representation depicted in FIG. 2, i.e., a tree of modules. If there is an error in the design input from the user, as determined in step 554, the user input is dropped and a notice is sent in step 562 to the user via terminal 416. Next, in step 556, type checker 464 in ParseCheck function 550 type checks each module of the design and if there is any error as determined in step 558, again the user input is dropped and a notice is sent in step 562 to the user via terminal 416. After parsing and type checking the design input, generator 456 in ParseCheck function 550 generates in step 560 a representation of the design as a set of components of distributed system 300 depicted in FIG. 3 and function 550 returns the representation in step 564, where a component is a representation suitable for running in a software or hardware engine.

In one embodiment, the representation of a component as a module for a software engine is an intermediate representation (IR). The IR is an alternate representation of the user's program in which module instantiations are replaced by hooks for communication with the runtime. Using the hooks, the original hierarchy of a module is maintained by modules in the hierarchy communicating via the runtime system. The format of a component for a software engine is further described in reference to FIG. 11B.

Figure 11A:
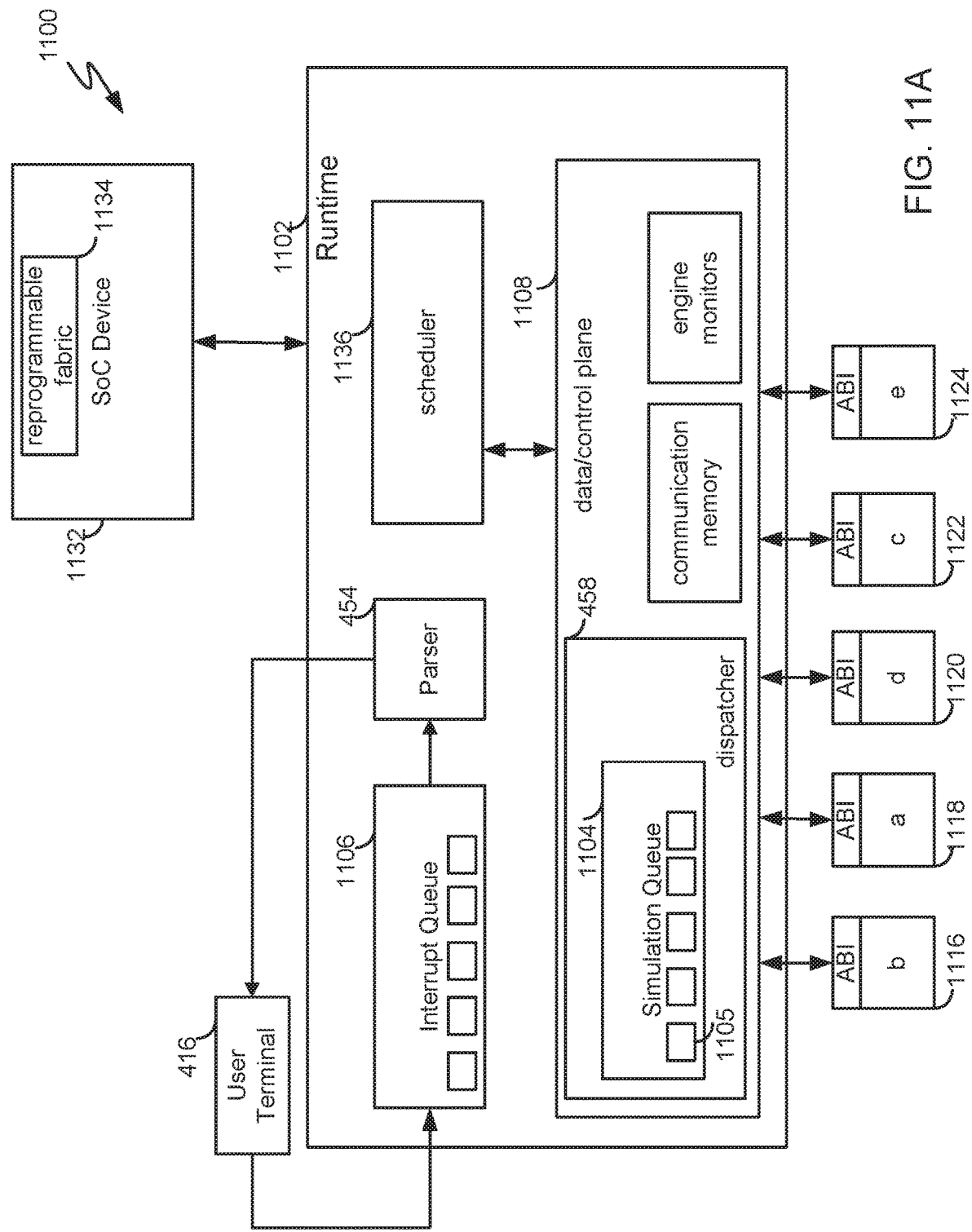
FIG. 11A depicts details of a runtime system for management of the execution of software and hardware, according to an embodiment.
Figure 11B:
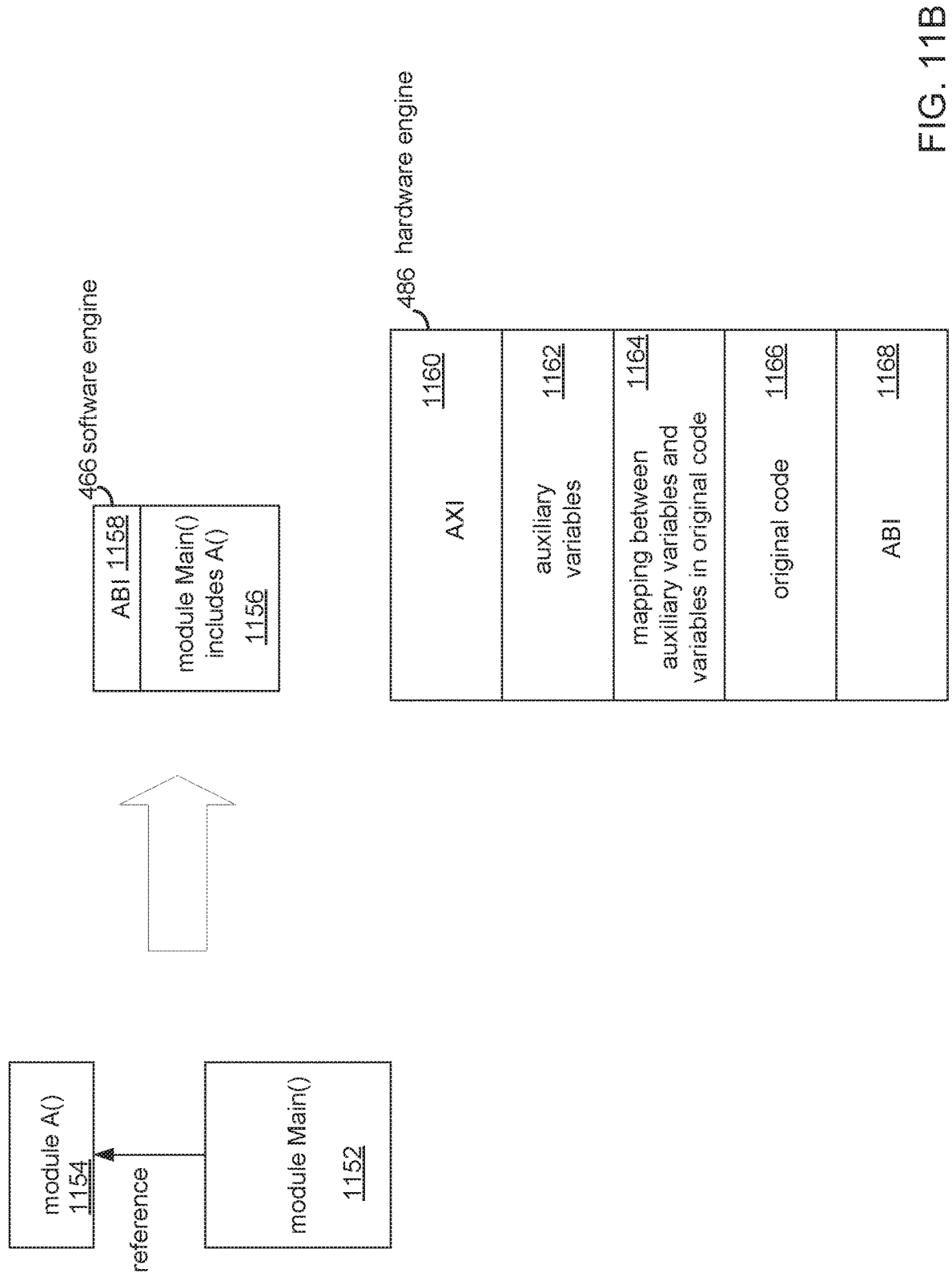
FIG. 11B depicts the details of code for a software engine and a hardware engine, according to an embodiment.

In the embodiment, the representation of a component for a hardware engine is one that that includes a number of code sections and is further described in reference to FIG. 11B. In addition, a component for a hardware engine may be a standard library component, which is a pre-compiled component that is available to be connected to user-components and is targeted for a particular FPGA type.

Figure 6A:
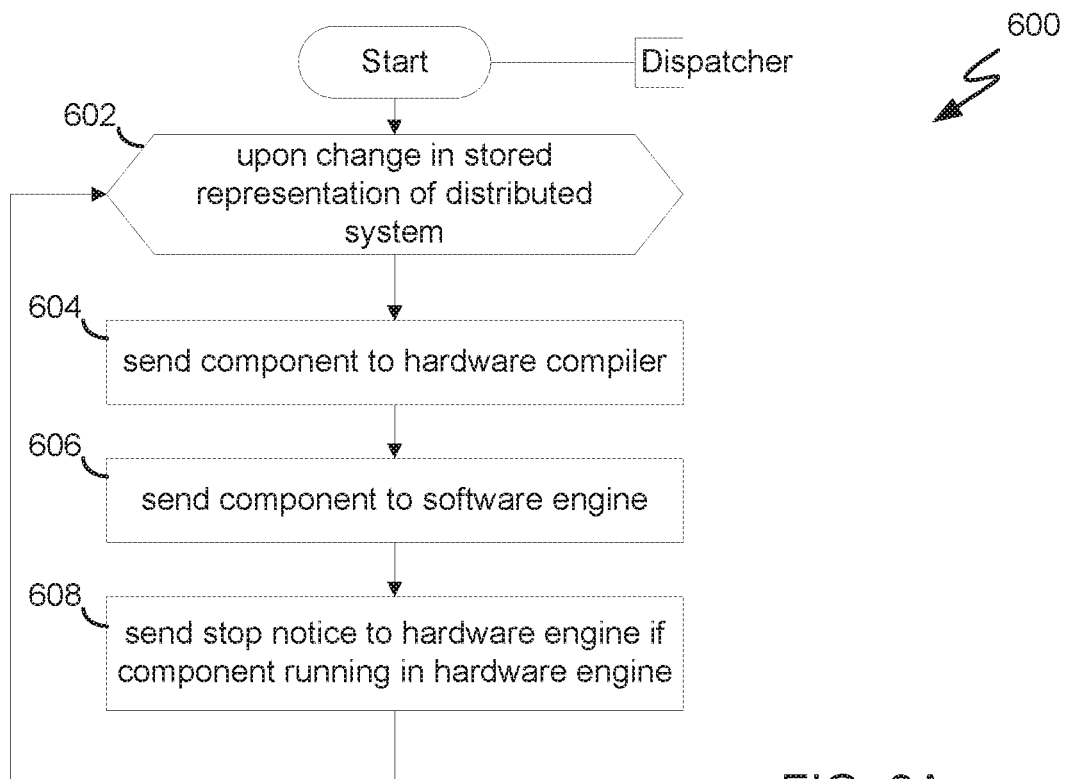
FIG. 6A depicts a flowchart of operations performed by an aspect of the dispatcher of the runtime system in FIG. 4B according to an embodiment.

FIG. 6A depicts a flowchart of operations performed by an aspect of dispatcher 458 of runtime system 452 in FIG. 4B according to an embodiment. In FIG. 6A, upon detecting in step 602 that one of the components of the stored representation of distributed system 300 has been changed, dispatcher 458 sends the changed component in step 604 to hardware compiler 478 and at the same time to one of the available software engines 466, 468, 470 in step 606. In addition, if one of the hardware engines 486, 488, 490 was running the component prior to the change, then dispatcher 458 sends in step 608 a stop notice to that hardware engine. Thus, one of the software engines 466, 468, 470 simulates the changed component while at the same time hardware compiler 478 compiles the changed component.

Figure 6B:
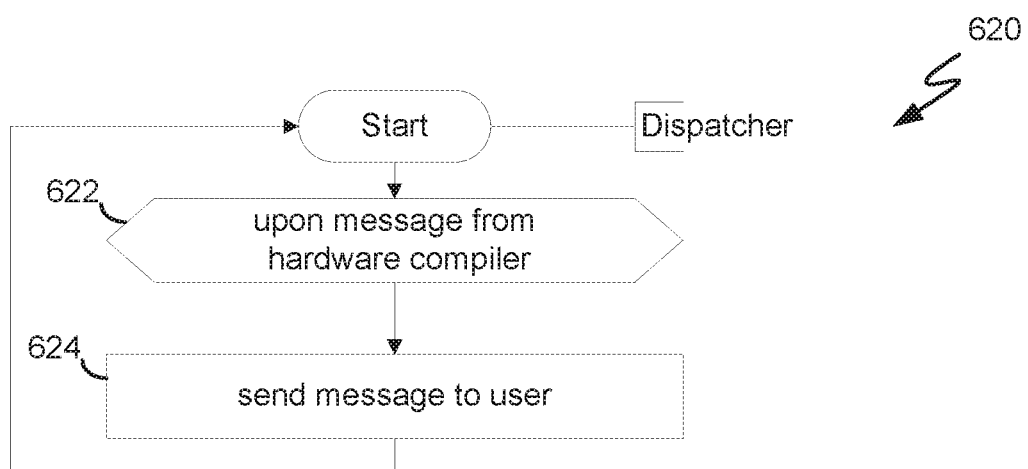
FIG. 6B depicts a flowchart of operations performed by another aspect of the dispatcher of the runtime system in FIG. 4B according to an embodiment.

FIG. 6B depicts a flowchart 620 of operations performed by another aspect of dispatcher 458 of runtime system 452 in FIG. 4B according to an embodiment. In FIG. 6B, when dispatcher 458 receives any message from hardware compiler 478 in step 622, it forwards in step 624 the message to the user via user terminal 416. These messages inform the user of any errors detected by dispatcher 458 or hardware compiler 478 and which require user correction.

Figure 6C:
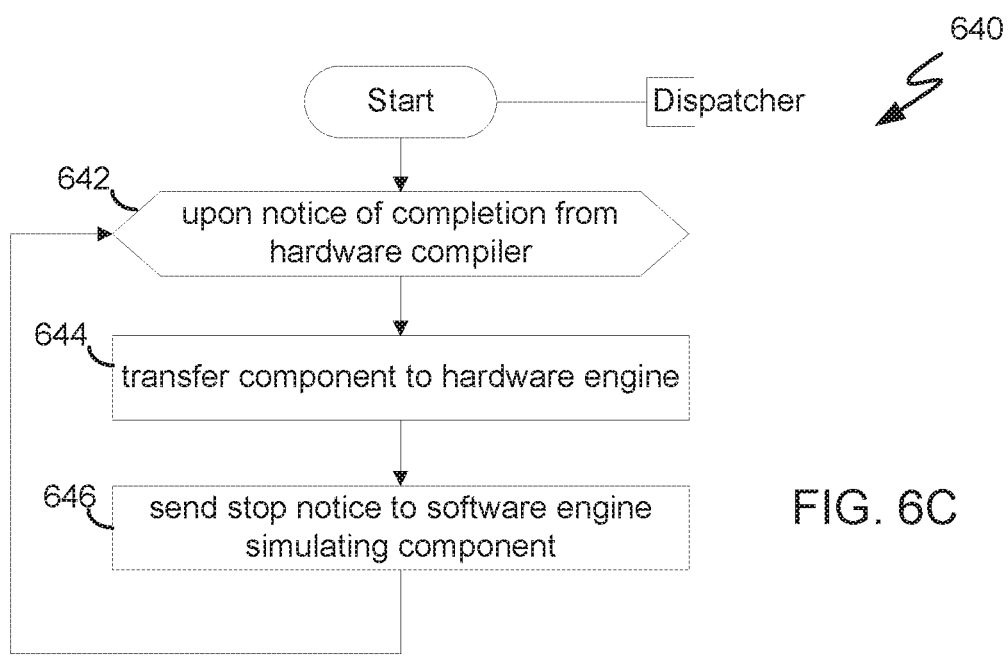
FIG. 6C depicts a flowchart of operations performed by yet another aspect of the dispatcher of the runtime system in FIG. 4B according to an embodiment.

FIG. 6C depicts a flowchart 640 of operations performed by yet another aspect of dispatcher 458 of runtime system 452 in FIG. 4B according to an embodiment. In FIG. 6C, when dispatcher 458 receives notice of completion from hardware compiler 478 in step 642, dispatcher 458 transfers the component in step 644 to one of the available hardware engines 486, 488, 490 and in step 646 sends a stop notice to the software engine simulating the component.

Figure 6D:
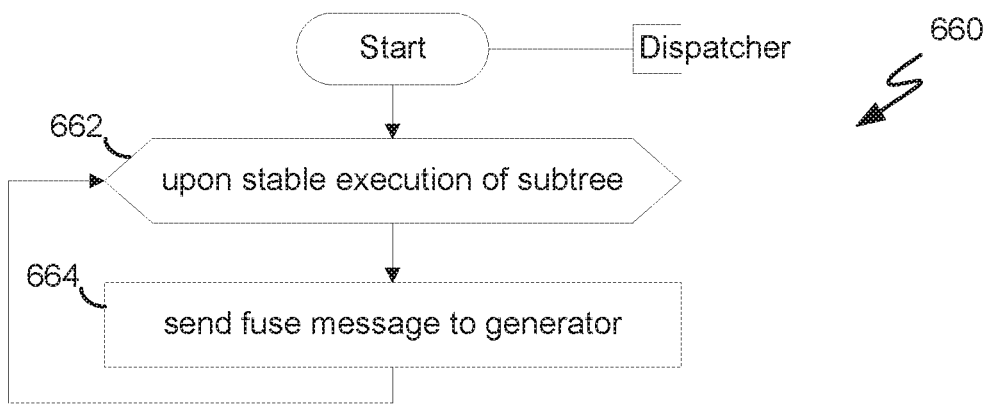
FIG. 6D depicts a flowchart of operations performed by yet another aspect of the dispatcher of the runtime system in FIG. 4B according to an embodiment.

FIG. 6D depicts a flowchart 660 of operations performed by yet another aspect of dispatcher 458 of runtime system 452 in FIG. 4B according to an embodiment. In FIG. 6D, when dispatcher 458 discovers that all of the components of a sub-tree of the design in FIG. 2 have met a stability test in step 662, dispatcher 458 sends in step 664 an inline message to generator 456. In one embodiment, the stability test determines that the components of a given sub-tree, say, for example, components 104, 112, 114 in FIG. 2, have been running for a certain amount of time without requiring correction by the user and thus represent a stable design. The inline message requests that generator 456 inline the components of the sub-tree together to become a single component. The request initiates storage of the updated design as described in reference to FIG. 5A.

Figure 6E:
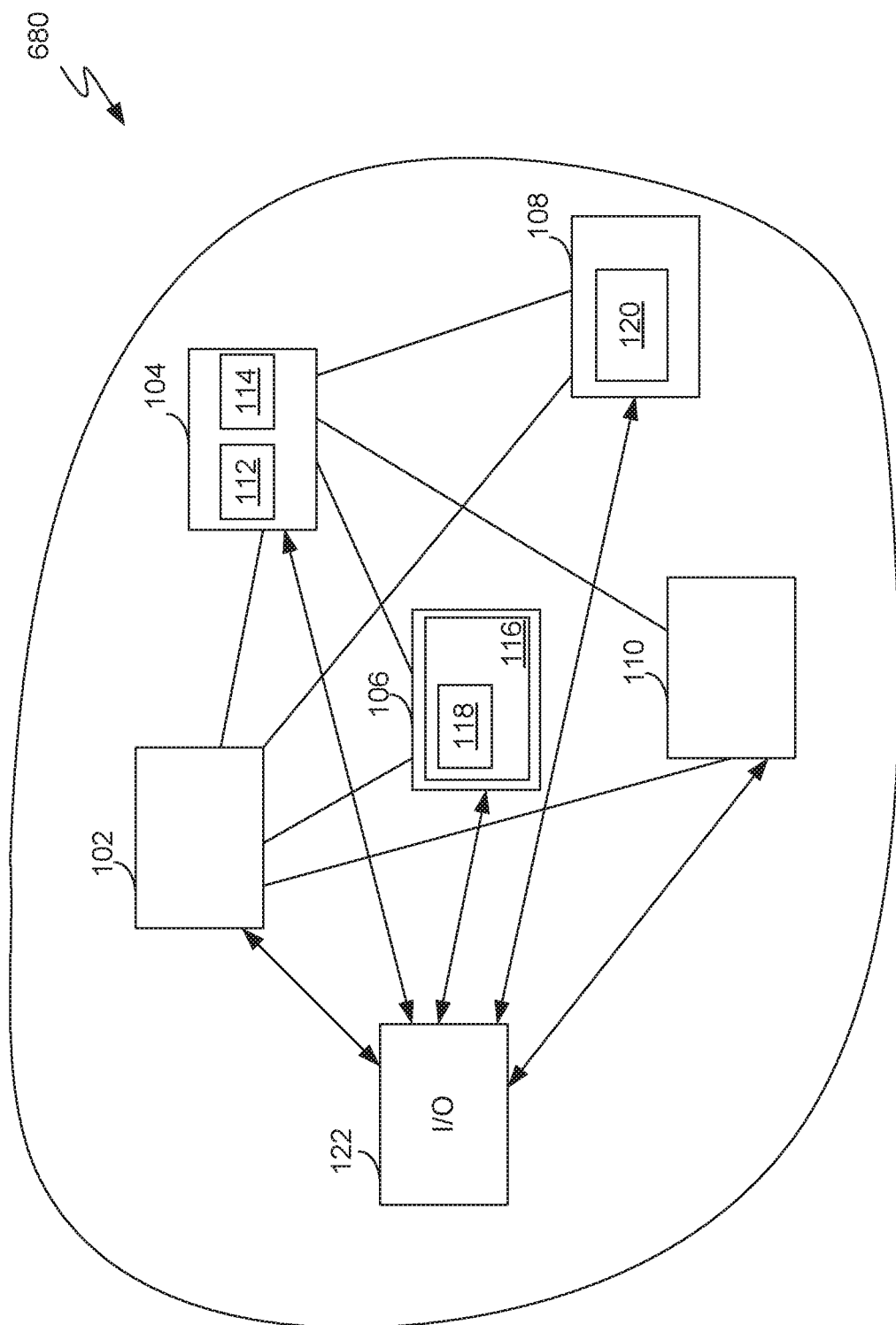
FIG. 6E depicts the distributed system of FIG. 3 after fusions have occurred.

FIG. 6E depicts the distributed system 680 of FIG. 3 after fusions have occurred. In the figure, components 112 and 114 have been running for a predetermined amount of time without requiring correction by the user and thus meet a criterion for a stable design. So, components 112 and 114 are inlined into component 104, which is now treated as a single component. Similarly, components 116 and 118 have been inlined into component 106 and component 120 is inlined onto 108. Eventually, the entire design becomes inlined into a single component.

Figure 7A:
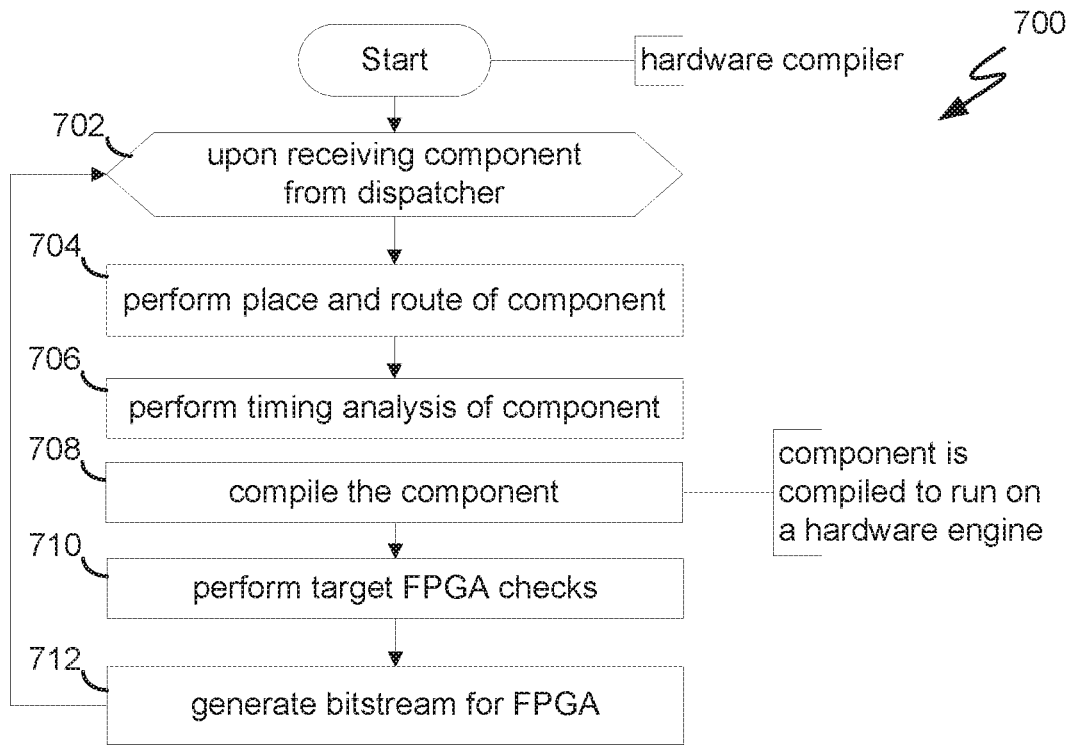
FIG. 7A depicts a flowchart of an aspect of the hardware compiler in the runtime system of FIG. 4B according to an embodiment.

FIG. 7A depicts a flow chart 700 of an aspect of hardware compiler 478 in runtime system 452 of FIG. 4B according to an embodiment. When hardware compiler 478 receives a component from dispatcher 458 in step 702, hardware compiler 478 performs a place and route in step 704, and a timing analysis in step 706 of the component. In one embodiment, the place and route and timing analysis conform to the design flow of Quartus®. Also, in some embodiments, pre-compiled components are added to the component for communicating with communications memory 460 in runtime system 452 and for interacting with any external devices, such as buttons, switches and transducers. In step 708, hardware compiler 478 compiles the component so that it can run on a hardware engine and in step 710, performs checks to ensure that the design of the component is operable in a target FPGA according to the constraints imposed by the particular FPGA. In step 712, hardware compiler 478 generates an appropriate bitstream for programming the targeted FPGA. Steps 704-712 are repeated for each component received from dispatcher 458.

Figure 7B:
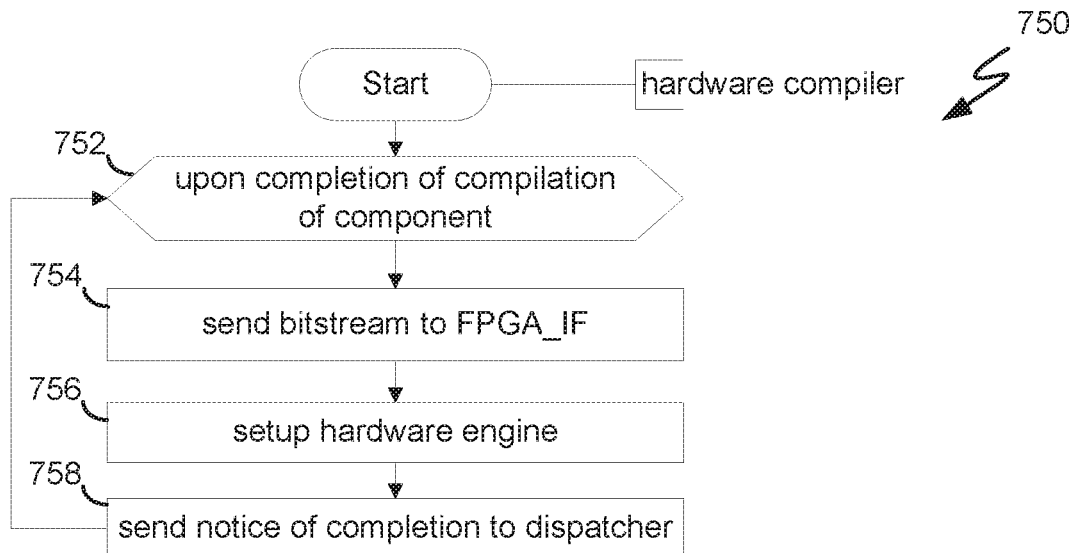
FIG. 7B depicts a flowchart of operations performed by another aspect of the hardware compiler in the runtime system of FIG. 4B according to an embodiment.

FIG. 7B depicts a flowchart 750 of operations performed by another aspect of the hardware compiler in the runtime system of FIG. 4B according to an embodiment. In FIG. 7B, when hardware compiler 478 completes a compilation of a component in step 752, hardware compiler 478 sends the previously generated bitstream for the component to FPGA interface 418 in step 754 and sets up an available hardware engine to execute the component in step 756. In step 758, hardware compiler 478 sends notice of completion to dispatcher 458 via path 480 in FIG. 4B.

Figure 8:
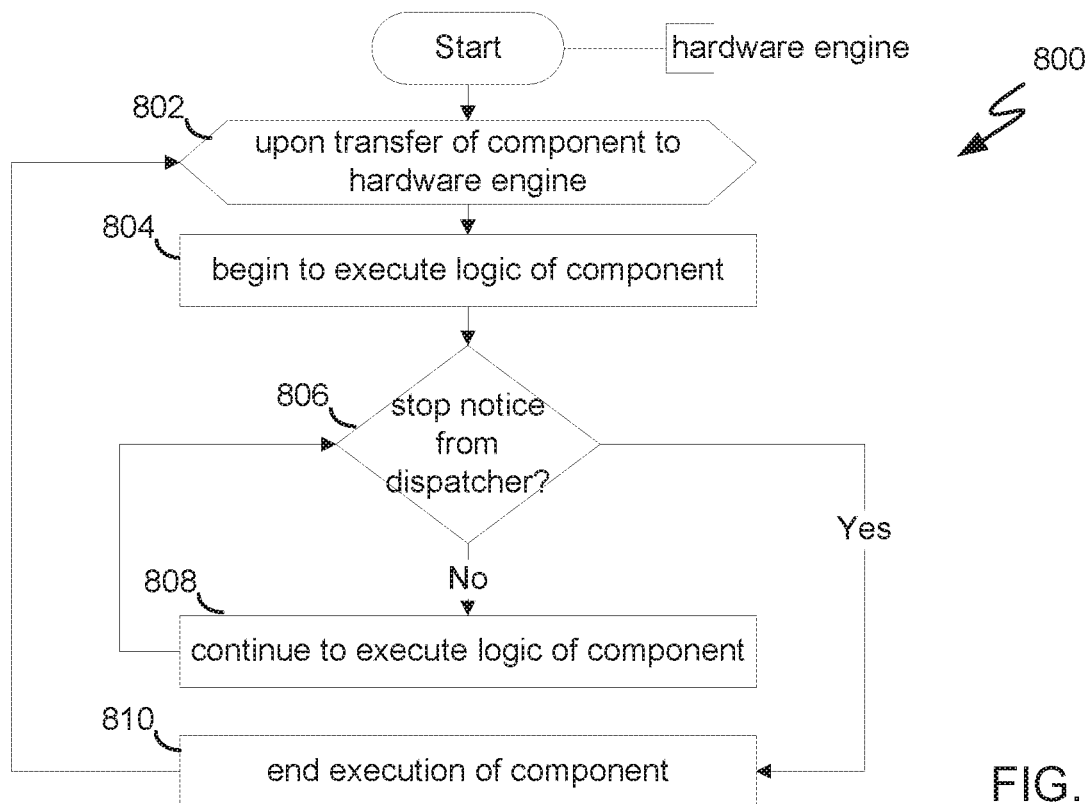
FIG. 8 depicts a flowchart of operations performed by a hardware engine in the runtime system of FIG. 4B according to an embodiment.

FIG. 8 depicts a flowchart 800 of operations performed by a hardware engine in runtime system 452 of FIG. 4B according to an embodiment. Upon transfer of a component to one of the hardware engines 486, 488, 490 in step 802, the hardware engine begins simulation of the component in step 804. If, in step 806, the hardware engine receives a stop notice from hardware compiler 478 via path 484, then the hardware engine ends execution of the component in step 810. Otherwise, it continues executing the component in step 808.

Figure 9:
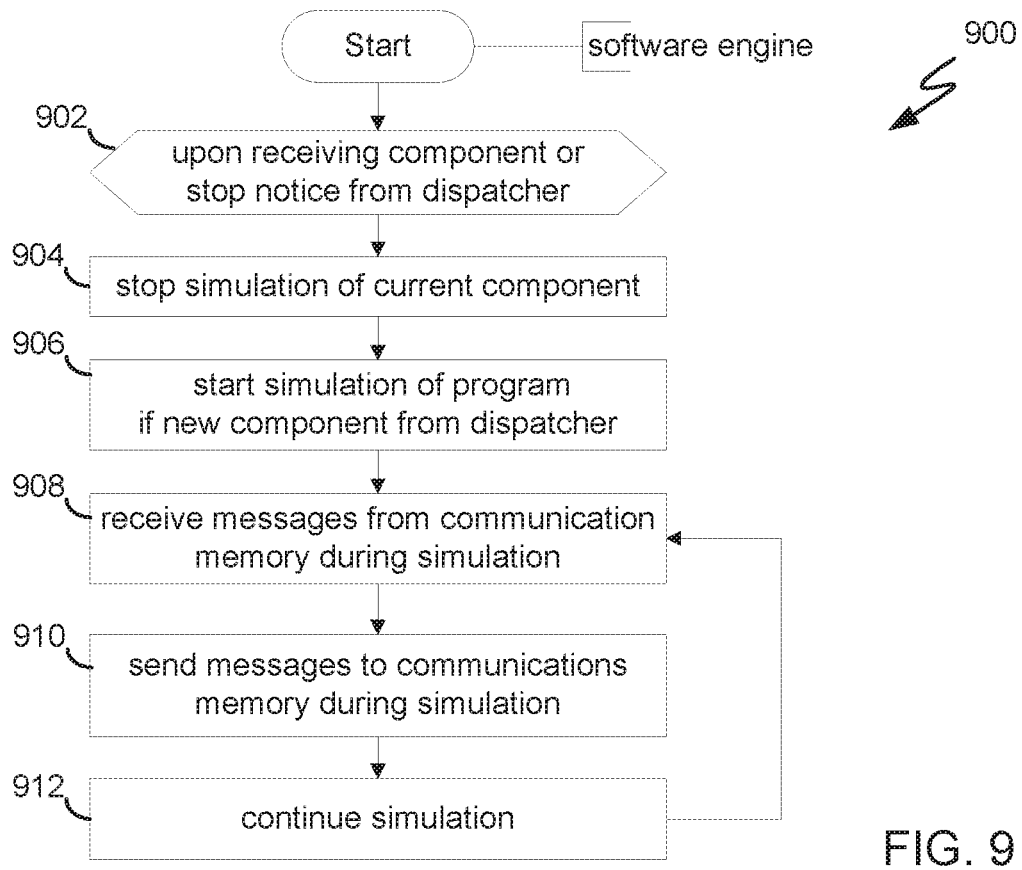
FIG. 9 depicts a flowchart of operations performed by one of the software engines runtime system of FIG. 4B according to an embodiment.

FIG. 9 depicts a flowchart 900 of operations performed by one of the software engines 466, 468, 470 in runtime system 452 of FIG. 4B according to an embodiment. In step 902, when the software engine receives a component from dispatcher 458 or a stop notice from dispatcher 458 via path 487, it stops simulation of any current component it is simulating in step 904. If a new component was received, the software engine starts the simulation of the just received component in step 906. While continuing simulation in step 912, it receives messages from communication memory in step 908 and sends messages to communications memory in step 910. Simulation continues until dispatcher 458 sends a new component in step 902 for simulation.

Figure 10:
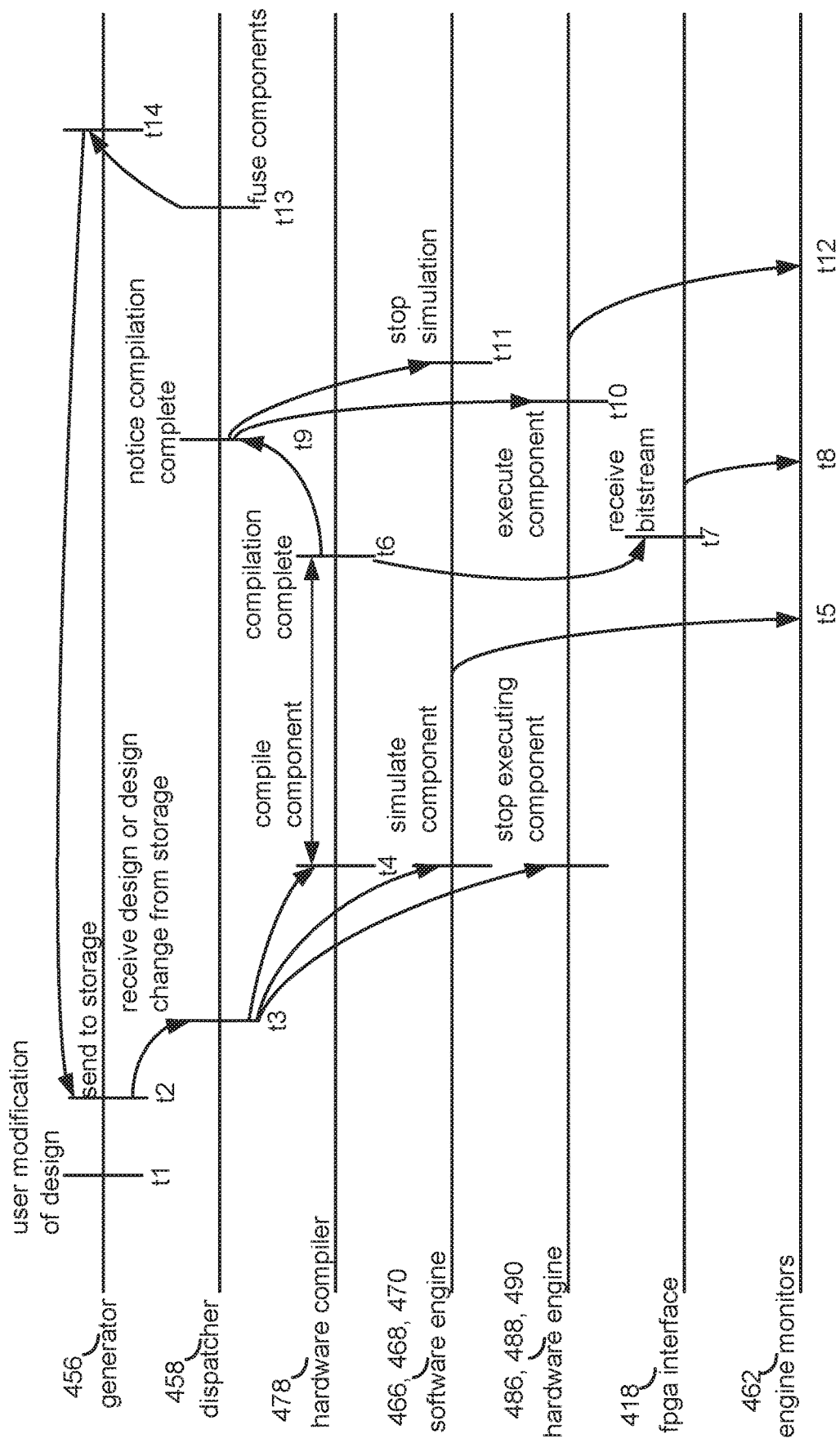
FIG. 10 depicts a timeline in one embodiment for the activities of generator, dispatcher, hardware compiler, one of the software engines, one of the hardware engines and the engine monitors of FIG. 4B.

FIG. 10 depicts a timeline in one embodiment for the activities of generator 456, dispatcher 458, hardware compiler 478, one of the software engines 466, 468, 470, one of the hardware engines 486, 488, 490 and engine monitors 462 of FIG. 4B. At time t1, generator 456 generates components of a design or modified design in accordance with the steps of FIGS. 5A, 5B. At time t2, generator 456 stores the design or modified design in storage. At time t3, dispatcher 458 receives the modified design and at time t4 sends a modified component to hardware compiler 478, to one of the software engines 466, 468, 470 and a notice to stop one of the hardware engines 486, 488, 490 currently simulating the component in accordance with the steps of FIG. 6A. A time t5, during the simulation of the component, one of the software engines 466, 468, 470 sends communication messages to one of the engine monitors 462 to communicate with other components of the design. At time t6, hardware compiler 478 indicates that the compilation of the component is completed. At time t7, hardware compiler 478 sends the bitstream for the component to FPGA interface 418 so that it can be downloaded into one or more FPGAs. At time t8, FPGA interface 418 sends messages to one of monitoring engines 462 so that one or more of the FPGAs can communicate with other components of the design. At time t9, hardware compiler 478 notifies dispatcher 458 that the compilation of the component is complete. At time t10, dispatcher 458 sends the component to one of the available hardware engines 486, 488, 490 and, at time t11, stops simulation of the component in the software engine. At time t12, one of the hardware engines 486, 488, 490 running the component sends messages to one of engine monitors 462 to communicate with the other components of the design. At time t13, dispatcher 458 notifies the user of a stable set of components and a request to inline the set of components into a single component and, at time t14, sends the modified design to storage 414. The process then repeats until the entire design is inlined into a single component.

Several advantages arise from the above-described system. First, because components of the design can reside in either hardware engines or software engines, the design can be moved to a different set of hardware and software engines residing on a runtime system of a different computer system. Second, because the hardware compiler can be configured to generate bit streams for any target FPGA, not all of the FPGAs need to be of the same type. Mixing of different FPGAs from different vendors is possible. Third, the FPGAs available on one computer system can be different on another computer system to which the design is moved.

Execution with Software and Hardware Engines

A simple model for execution of a Verilog® program requires that all changes to the stateful components in the module, such as registers, and all changes to the stateless components, such as logic gates and wires, be tracked. Changes to stateful components are referred to as update events and changes to stateless components are referred to as evaluation events.

One implementation of this execution model is a scheduler, which uses a central queue to cause updates and evaluations to be performed among the several components in the software and/or hardware engines. Updates are those events that change storage registers while evaluations are those events that evaluate combinational logic.

This simulation model has limited throughput and awkward communication between modules because of the central queue.

FIG. 11A depicts details of a runtime system 1102 for management of the execution of software and hardware engines, according to an embodiment. Runtime system 1102 highlights additional aspects of runtime system 452 and includes an interrupt queue 1106, a data/control plane containing dispatcher 458, communication memory 460 and engine monitors 462. Dispatcher 458 contains a simulation queue 1104 which contains a separate queue 1105 for each module running in a software engine or hardware 1116, 118, 1120, 1122, 1124 and a scheduler 1136 described in more detail in reference to FIGS. 12A, 12B, 13A, 13B and 13C. Software engines are event-driven and have a performance approximately equivalent to Icarus Verilog (iVerilog). Hardware comprises hardware engines and FPGAs or re-programmable fabric. Interrupt queue 1106, connected between user terminal 416 and parser 454, aids in the interaction of the user with runtime system 1102 so that user input can affect the parser at precise times during execution of the modules. Separate queues 1105 for each module improve performance by allowing each module to be concurrently executed.

Runtime system 1102 architecture communicates with either software engines or hardware 1116, 1118, 1120, 1122, 1124, respectively for module a, module b, module c, module d and module e via the data/control plane 1108 with each module having a standardized Application Binary Interface (ABI), which in one embodiment includes the following functions.

| ABI function |
| --- |
| there_are_updates( ) as bool |
| evaluate( ) |
| update( ) |
| read(e as Event) |
| write(e as Event) |
| io(e as Event) |
| get_state( ) as State |
| set_state(s as State) |

| ABI function |
| --- |
| display(s as String) |
| forward(c as Engine) |
| open_loop(steps as Int) |
| end_step( ) |
| finish( ) |
| end( ) |

The function 'there_are_updates( )' queries a module and returns a Boolean to indicate whether or not there are any updates. The function 'evaluate( )' requests that the module empty its queue of evaluation events by processing such events. Processing such events involves reading and writing values to and from the data plane. The function 'update( )' requests that the module empty its queue of update events by processing such events. The function 'read(e as Event)' requests that the module become informed of an event, e. The function 'write(e as Event)' requests that module output an event, e. The function 'io(e as Event)' requests that the module perform an io operation event, e, such as changing an I/O resource or illuminating an LED. The function 'get_state( )' is a message that runtime system 1102 sends to a software engine or hardware in the process of in-lining or fusing as further described in regard to FIGS. 14 and 15. The message requests of the engine executing the module that all values of the internal state (i.e., the state of all of the stateful objects) be returned by the function whose return type is State. The function 'set_state(s as State)' is a message that runtime system 1102 sends to an engine which just had one more modules inlined into it. The message requests that values of the internal state, the variable s having type State, of the module be loaded. The function 'display(s as String)', which is a directive to the runtime system 1102, requests that runtime system 1102 display the variable s of type String on the user output interface, such as user terminal 416. The directive can be included in the module code and causes, when encountered, a software or hardware engine to yield to the runtime system 1102 to have the directive executed by runtime system 1102. Other functions, such as 'monitor(x)', which is also a directive to the runtime system 1102 and produces a print statement whenever the value of x changes, can be included. The function 'forward(c as Engine)' is a request by a module that the specified engine, c, handle the request. The function 'open_loop(steps as Int)' requests that an engine iterate for a requested integer number of steps of the scheduler. The requested number of steps determines how long the engine runs on its own without communication with other engines via the runtime system, thus reducing expensive communication with other engines. An engine may end its iterations before the requested number of steps if an intervention of the runtime system is needed, say to carry out a 'display(s)' function. The 'end_step( )' is invoked by the runtime system for every engine at the end of each iteration of the scheduler, thus notifying each engine that a scheduler step has ended. The 'finish( )' function is a message invoked by an engine. The message tells the runtime system to request that all of the engines stop running. In response, the runtime system sends (i.e., invokes) an 'end( )' function to every engine to carry out the request.

Runtime system 1102 architecture is also coupled to an SoC device 1132 containing a reprogrammable fabric 1134. SoC device 1132, in one embodiment, is an Intel Cyclone V ARM system with a reprogrammable fabric 1134 of 110K logic elements and a 50 MHz clock.

FIG. 11B depicts the details of code for a software engine and a hardware engine. In the example depicted, a component Main( ) 1152 for a software engine references module A( ) 1154. Intermediate representation code for a software engine instantiates module A( ) 1154 into the code for Main ( ) 1152 to create code 1156 and adds automatically generated code supporting the ABI interactions with the runtime system to the code 1156. Intermediate representation code for a hardware engine includes the original code 1166 for the component, a number of auxiliary variables 1162, an ABI 1168, an advanced extensible interface (AXI) interface 1160 and a mapping 1164 of auxiliary variables 1162 to variables in other sections of the intermediate representation code for the hardware engine. AXI interface 1168 consists of a number of different memory-mapped IO channels for sending data to and receiving data from other components.

Figure 12A:
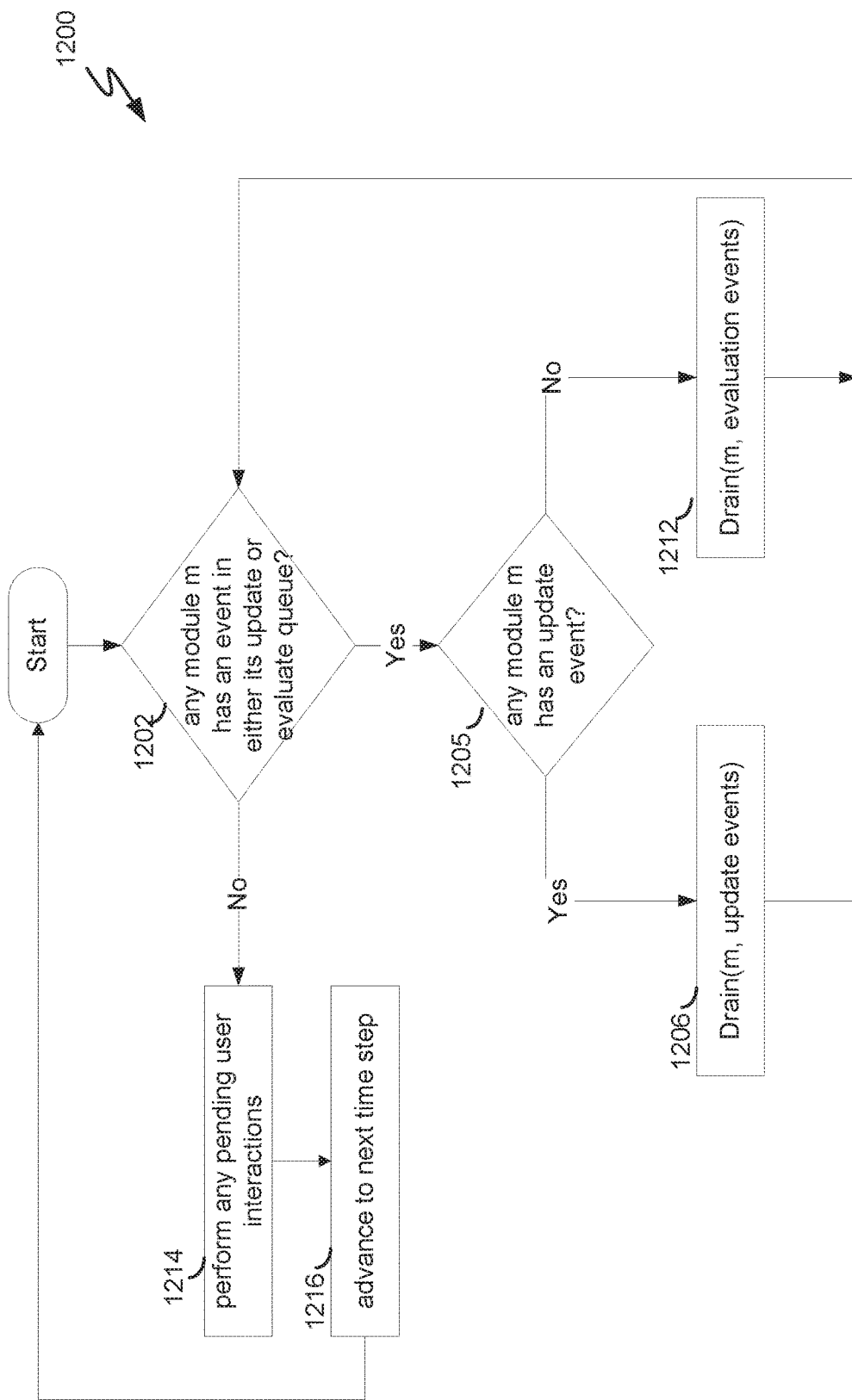
FIG. 12A depicts a flowchart of the operation of a scheduler in the runtime system in which each module has a queue, according to an embodiment.

FIG. 12A depicts a flowchart of the operations of a scheduler in the runtime system in which each module has both an evaluation queue and an update queue. In procedure 1200, runtime system 1102 executes step 1202 to determine whether any module has any events in its evaluation queue or any events in its update queue. If any module has an event, then, in step 1205, runtime system 1102 determines if the event is in the update queue. If so, then runtime system 1102 calls a drain function DRAIN(m, update events) in step 1206, where the drain function performs an update for module m as detailed in regard to FIG. 13. If, as determined in step 1205, the event is not in the update queue, then the event is in the evaluation queue and runtime system 1102 calls DRAIN(m, evaluation events) in step 1212 for module m as detailed in FIG. 13. If any module has any events still present in either its update or evaluate queue, as determined in step 1202, then runtime system 1102 repeats the drain function until no module has any update or evaluation events remaining. When this condition occurs (i.e., no branch in step 1202), then runtime system 1102 executes any pending user interactions in step 1214 and advances to the next time step in step 1216.

Figure 12B:
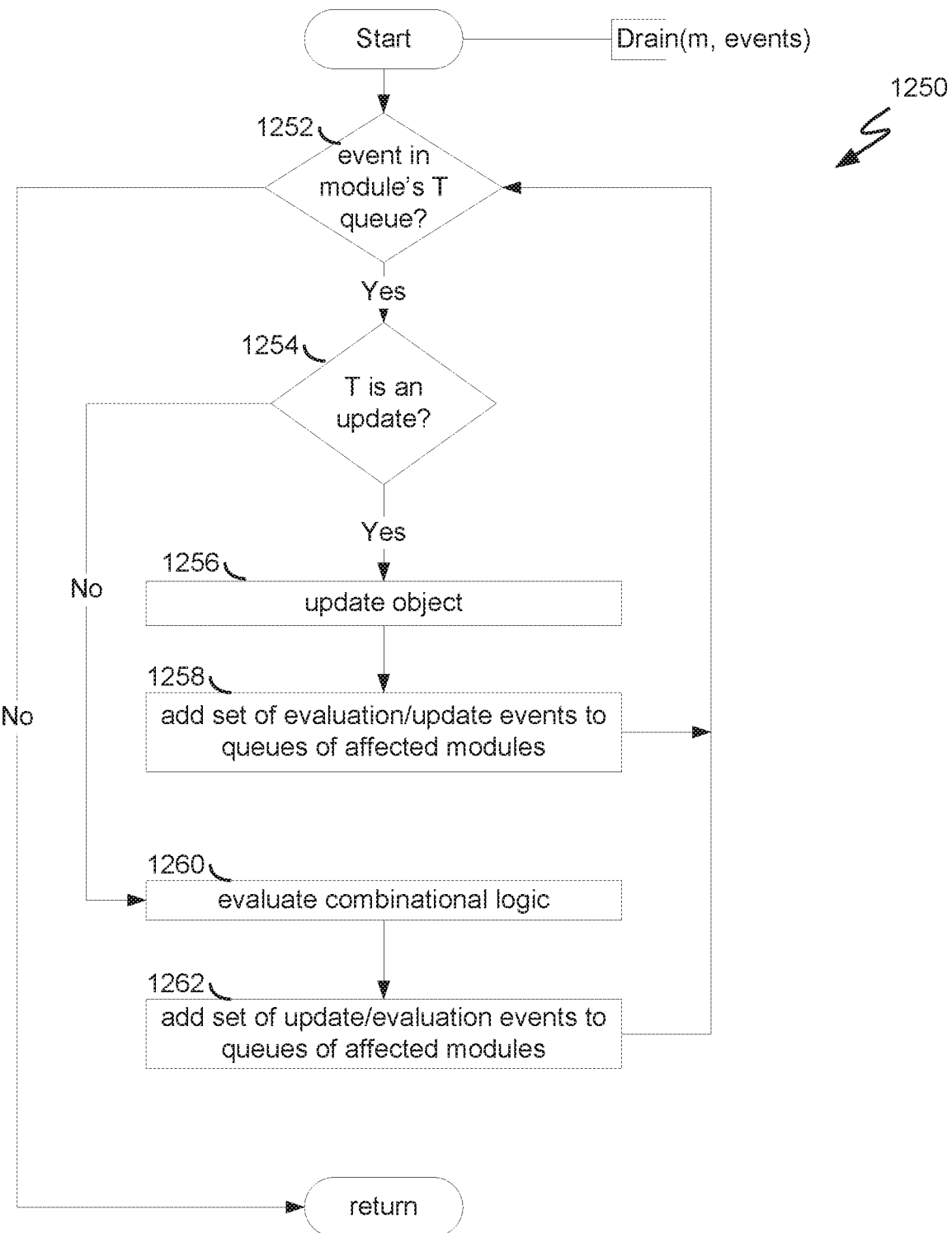
FIG. 12B depicts a flowchart of operations performed by the Drain function, according to an embodiment.

FIG. 12B depicts a flowchart 1200 of the operations performed by the drain function DRAIN(m, events) used in FIG. 12. Runtime system 1102 executes drain function to first determine according to step 1252 whether any events are present in the update queue or the evaluation queue of the module. If so, and events are present in the update queue (i.e., T, the type of event is an update) as determined in step 1254, then runtime system 1102 causes, via the update function in the ABI, an update of the affected object, such as a register or other stateful object, in step 1256 and in step 1258 adds any needed evaluation events and update events to the queues of any affected modules, as an update in one module can require an update in other modules. If any events are present in the evaluate queue (i.e., T, the type of event is an evaluate) of the module as determined in step 1254, then runtime system 1102 causes, via the evaluate function in the ABI, the evaluation of combinational logic, in step 1260 and step 1262 adds any resulting update events and evaluation events to the queues of any affected modules. The drain function returns when no event is present, as determined in step 1252.

Executing with a queue for each module minimizes the amount of communication that occurs across the data/control plane and maximizes the amount of parallelism which is exposed between modules.

Figure 12C:
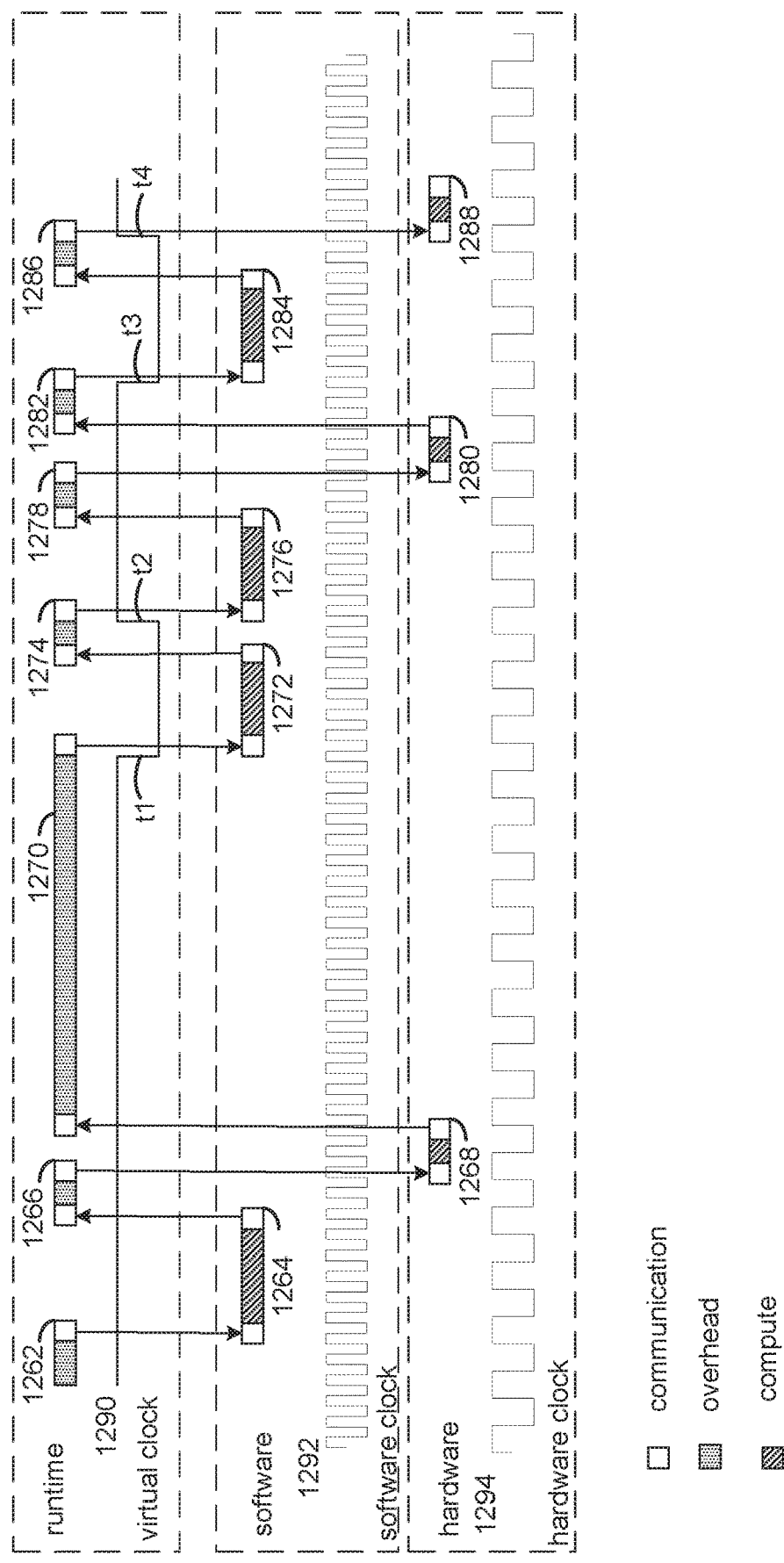
FIG. 12C depicts the virtual clock in relation to clocks for the software and hardware engines, according to an embodiment.

FIG. 12C depicts the virtual clock in relation to clocks for the software engine and the hardware engine. A tick of the virtual clock 1290 is defined as two iterations of scheduler 1136 in the runtime system 1102, and thus two transitions of clock 1290, such as t1-t2, t2-t3, t3-t4, which are created by scheduler 1136. The figure also depicts a software clock 1292 for software engines which runs in the GHz range and a hardware clock 1294 for FPGAs that runs in the MHz range. Also depicted are the activity intervals, 1262-1288 of runtime system 1102, and software and hardware engines 1116, 1118, 1120, 1122, 1124. Included in these activity intervals are communication intervals (no shading), overhead intervals (shaded) and compute intervals (hatched), as shown. For example, activity interval 1264 includes a first communication (clear portion) with runtime system 1102, computation interval (hatched portion) and a second communication (clear portion) with runtime system 1102. As is clear from the figure, communication between runtime system 1102 and the software and hardware engines 1116-1124 frequently occurs so that the different components being executed in the hardware and software engines can interact.

To have the software and hardware engines 1116-1124 run as fast as possible, it is desirable to reduce the number of interactions of the software and hardware engines 1116-1124 with runtime system 1102 including scheduler 1136. Several features help bring this about. First, user logic can be combined with other user logic (inlined) so that communication between the two pieces of logic does not involve runtime system 1102. Only the combined logic communicates with runtime system 1102. Second, communication between precompiled IO devices from the standard library and runtime system 1102 is avoided by using the 'forward( )' function in the ABI described above. According to this function, the user logic engine responds to requests on behalf of itself and any standard library components it contains without involving runtime system 1102. For example, evaluate requests on those engines are recursively invoked and the engines respond to 'there_are_updates' as true if the engine or the standard components therein have updates. Third, the 'open_loop(n)' function in the ABI allows a hardware engine to simulate as many iterations as possible. The engine remains in control of the iterations until either the upper limit is reached, as specified in the function, or a system task, such as a 'display(s)' function, requires runtime system 1102.

Figure 13A:
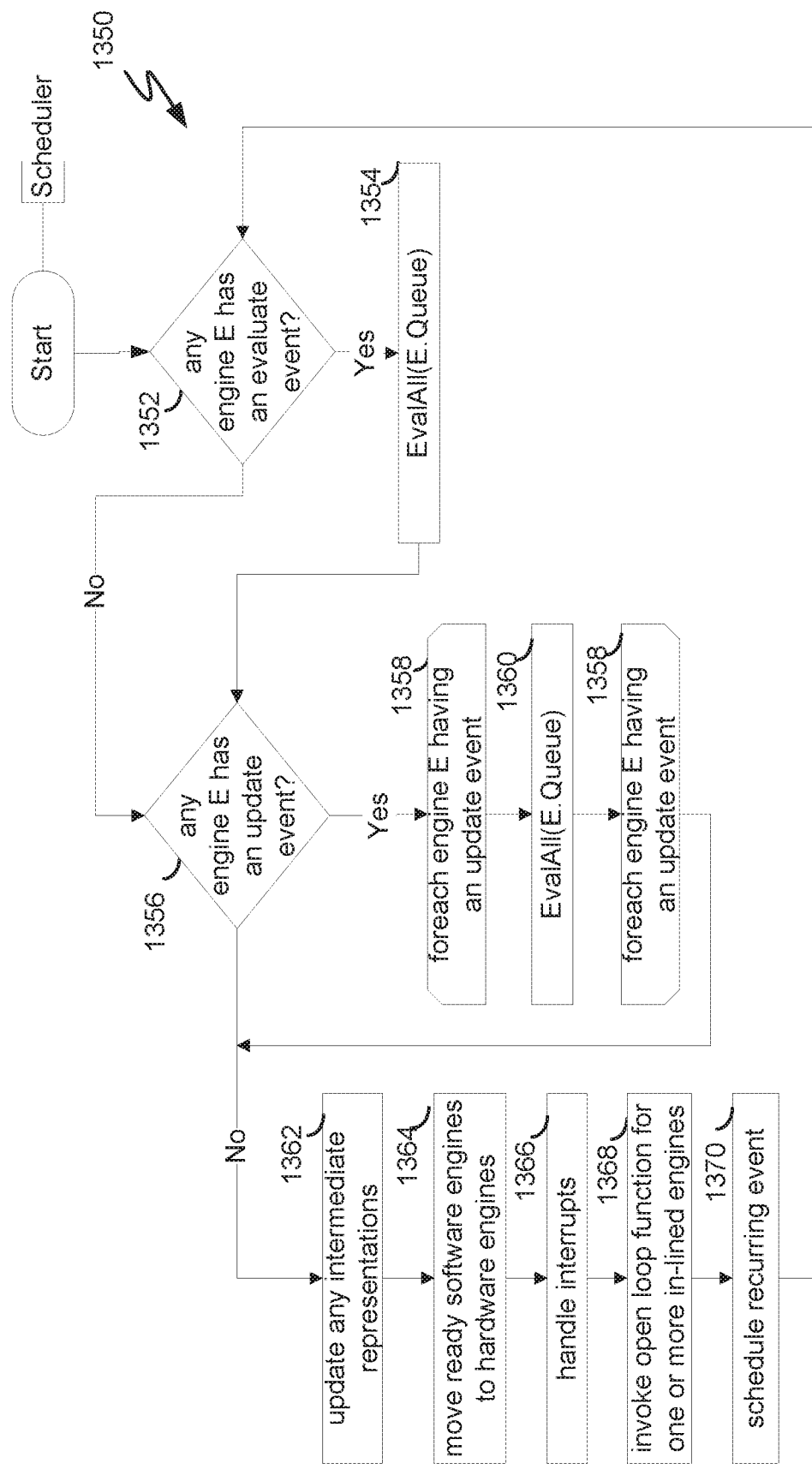
FIG. 13A depicts an alternative to the scheduler of FIG. 12A, according to an embodiment.

FIG. 13A depicts an alternative to the scheduler of FIG. 12A. In step 1352, scheduler 1136 determines whether any engine E has an evaluation event. If so, then in step 1354, scheduler 1136 calls the EvalAll function to perform all evaluation events in the engine E. If not, then in step 1356, scheduler 1136 determines whether any engine E has an update event. If so, then in steps 1358, 1360, scheduler 1136 calls the EvalAll function for every engine E that has an update event. Upon completion, scheduler 1136 performs steps 1362, 1364, 1366 and 1368, during the time window after all evaluation and update events are completed. In step 1362, scheduler 1136 updates any intermediate representations in the components. Updates include creating new engines (software or hardware) in response to modules that are newly instantiated but have not yet been processed and rebuilding engines based on new read/write patterns between modules. In step 1364, scheduler 1136 moves any ready software engines into available hardware engines. In step 1366, scheduler 1136 handles any pending interrupts. Handling pending interrupts includes passing display events to the user output interface, such as user terminal 416, in response to any 'display(s)' function or 'monitor' function directives embedded in the engine code and terminating an engine in response to a 'finish( )' function. In step 1368, scheduler 1136 identifies program states in which it is safe to stop hardware engine interaction with the runtime system and hand control over to the hardware engine by invoking its 'open_loop(n)' function. Such program states include those where the entire program has been inlined into a single module, and whose only interaction with a standard library component is the clock. In step, 1370, scheduler 1136 schedules any recurring events, such as virtual clock 1290. Thus, the time window in which scheduler 1136 executes steps 1362-1368 is a period of time between transitions of virtual clock 1290.

Figure 13B:
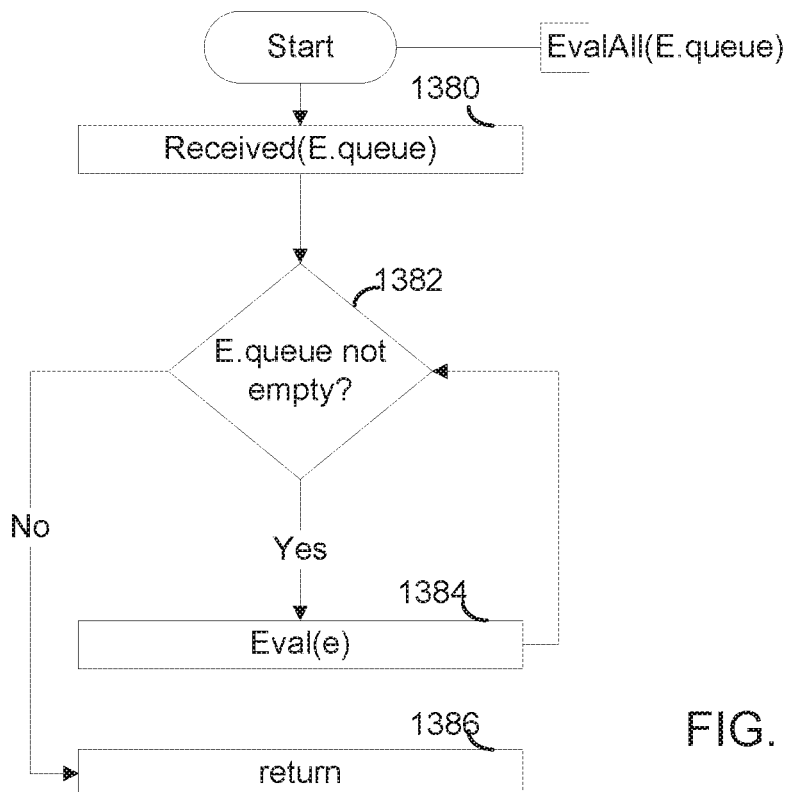
FIG. 13B depicts a flowchart of operations performed by the EvalAll function, according to an embodiment.

FIG. 13B depicts a flowchart of operations performed by the EvalAll function. In step 1380, the function receives the queue for the engine from the call in step 1360, where 'Received(item from source)' is a predicate that indicates that the 'item' was received via an underlying communication mechanism, such as a mailbox, shared memory location or high-speed serial link from the specified source. In step 1382, the function determines whether the queue for the engine E is empty. If not, then in step 1384, the function evaluates an event in the queue by calling Eval(e). The function continues to evaluate each event in the queue for the engine E until the queue is empty, at which point it returns in step 1386.

Figure 13C:
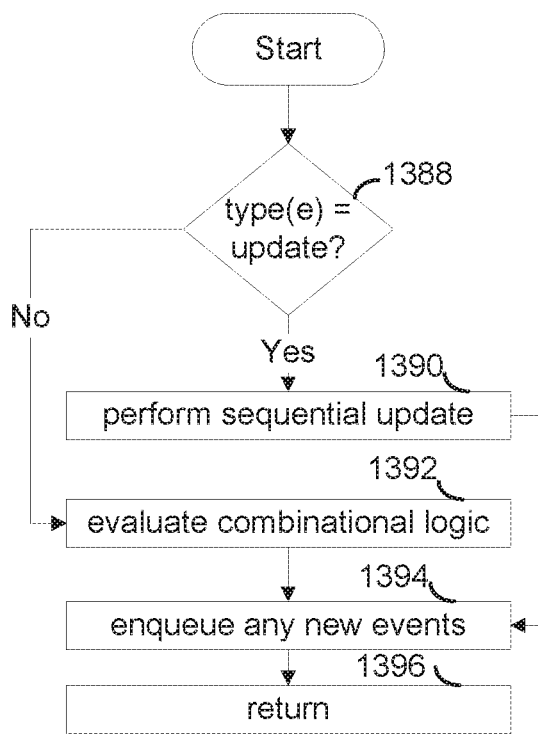
FIG. 13C depicts a flowchart of operations performed by the Eval(e) function, according to an embodiment.

FIG. 13C depicts a flowchart of operations performed by the Eval(e) function. In step 1388, the function determines the type of event in the queue. If the type of event is an update event, then in step 1390 the function performs a sequential update. Otherwise, the event is an evaluation event, so that in step 1392 the function performs an evaluation of the combination logic. In step 1394, the function enqueues onto the queue for E any new events caused by the sequential update or evaluation and in step 1396 returns to the EvalAll function.

Figure 14:
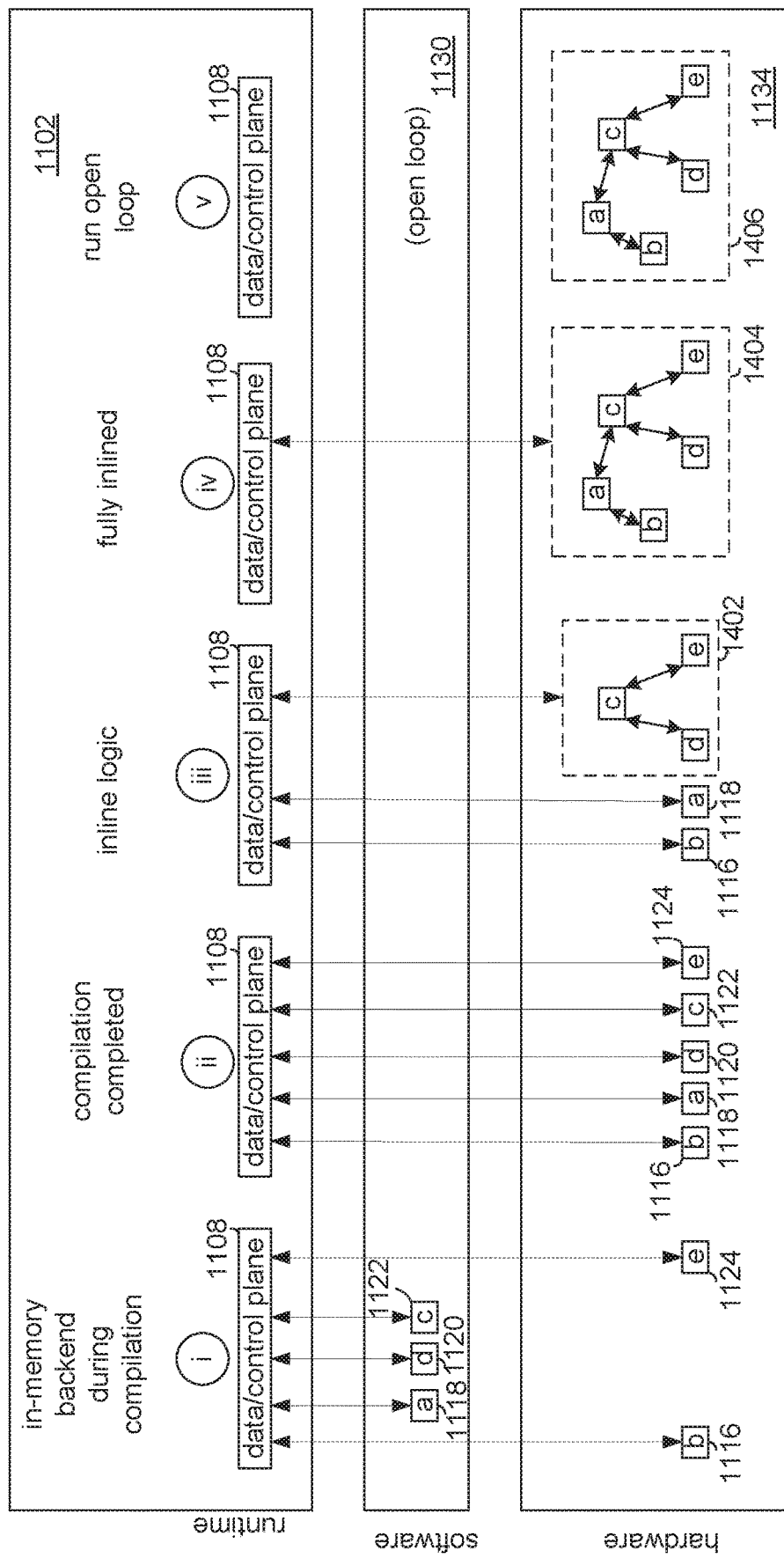
FIG. 14 depicts the pipeline of the runtime system, according to an embodiment.

FIG. 14 depicts a pipeline of runtime system 1102 in one embodiment. In the embodiment, there are five stages, i, ii, iii, iv and v, of processing, but more or fewer stages are possible. In stage i, module a 1118, module d 1120 and module c 1122 are being compiled, while module b 1116 and module e 1124 are already in hardware. Stage ii shows the case in which module a 1118, module c 1122, and module d 1120 have been moved into hardware after completion of their compilation for SoC device 1132. Stage iii shows the case in which module c 1122, module d 1120 and module e 1124 have been joined together (i.e., inlined) to become a single entity 1402. Stage iv shows the case in which module a 1118 and module b 1116 have been joined to each other and together with portion 1402, portion 1404 now being fully inlined in hardware. Stage v shows the case in which all of the modules are inlined and are operational as a stand-alone system 1406, that is, without the aid of communication via runtime system 1102. To reach stage v, dispatcher 458 instructs hardware compiler 478 to compile the entire set of modules to a bitstream for the target reprogrammable fabric. Modules in the reprogrammable fabric, however, are configured to respond to a get_state( ) request so that some or all of the modules can be moved back into software or one or more modules can be updated. In one embodiment, the logic to handle a get_state( ) request is embedded in the target reprogrammable fabric by including it in the bitstream which programs the reprogrammable target fabric.

Figure 15:
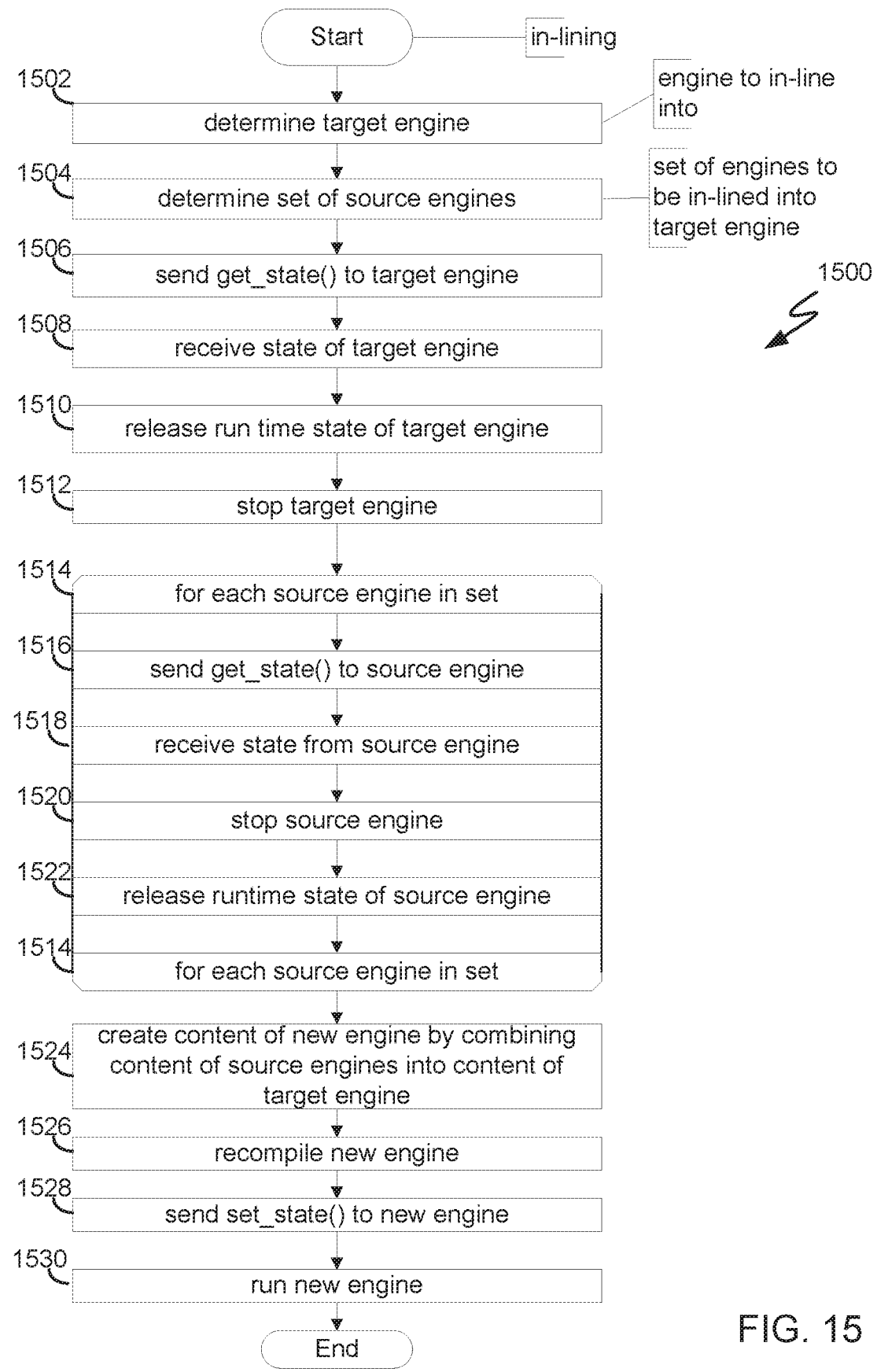
FIG. 15 depicts a flowchart of operations performed to in-line modules executed in one or more engines, according to an embodiment.

FIG. 15 depicts a flowchart 1500 of operations performed to inline modules executed in one or more engines. In step 1502, runtime system 1102 determines the target engine, i.e., the engine into which one or more source engines are to be inlined. In step 1504, runtime system 1102 determines the set of source engines, i.e., the one or more engines to be inlined into modules in the target engine. In step 1506, runtime system 1102 sends a get_state( ) request to the target engine. In step 1508, runtime system 1102 receives the requested state from the target engine. This state reflects the state of one or more modules being executed by the target engine, the state comprising any auxiliary software, such as call backs, and state data identifying the module or modules therein, and which the runtime system uses to communicate with the module or modules. In step 1510, runtime system 1102 releases (i.e., deletes) the runtime system state of the target engine and in step 1512, stops the target engine. Next, as specified by iterator 1514, runtime system 1102 executes steps 1516-1522 for each source engine in the set determined in step 1504. In step 1516, runtime system 1102 sends the get_state( ) request to the current source engine and in step 1518 receives the requested state (i.e., the state of all of the stateful elements) for the current source engine. In step 1520, runtime system 1102 stops the current source engine and in step 1522 releases the runtime system state of the current source engine. After performing steps 1516-1522 for each source engine in the set, runtime system 1102 in step 1524 creates content of a new engine by combining the content of source engines in the set with the content of target engine. For example, if the source set includes module a and module b, and the target engine has module 1402, as in stage iii of FIG. 14, then runtime system combines module a and module b with that of module 1402, as in stage iv of FIG. 14. In step 1526, runtime system 1102 recompiles the new engine (now containing module 1404 in FIG. 14) and in step 1528 sends the set_state( ) request to the new engine. In step 1530, runtime system 1102 starts the new engine, which now contains the combined modules, i.e., module 1404, of the source engines and the target engine.

Figure 16A:
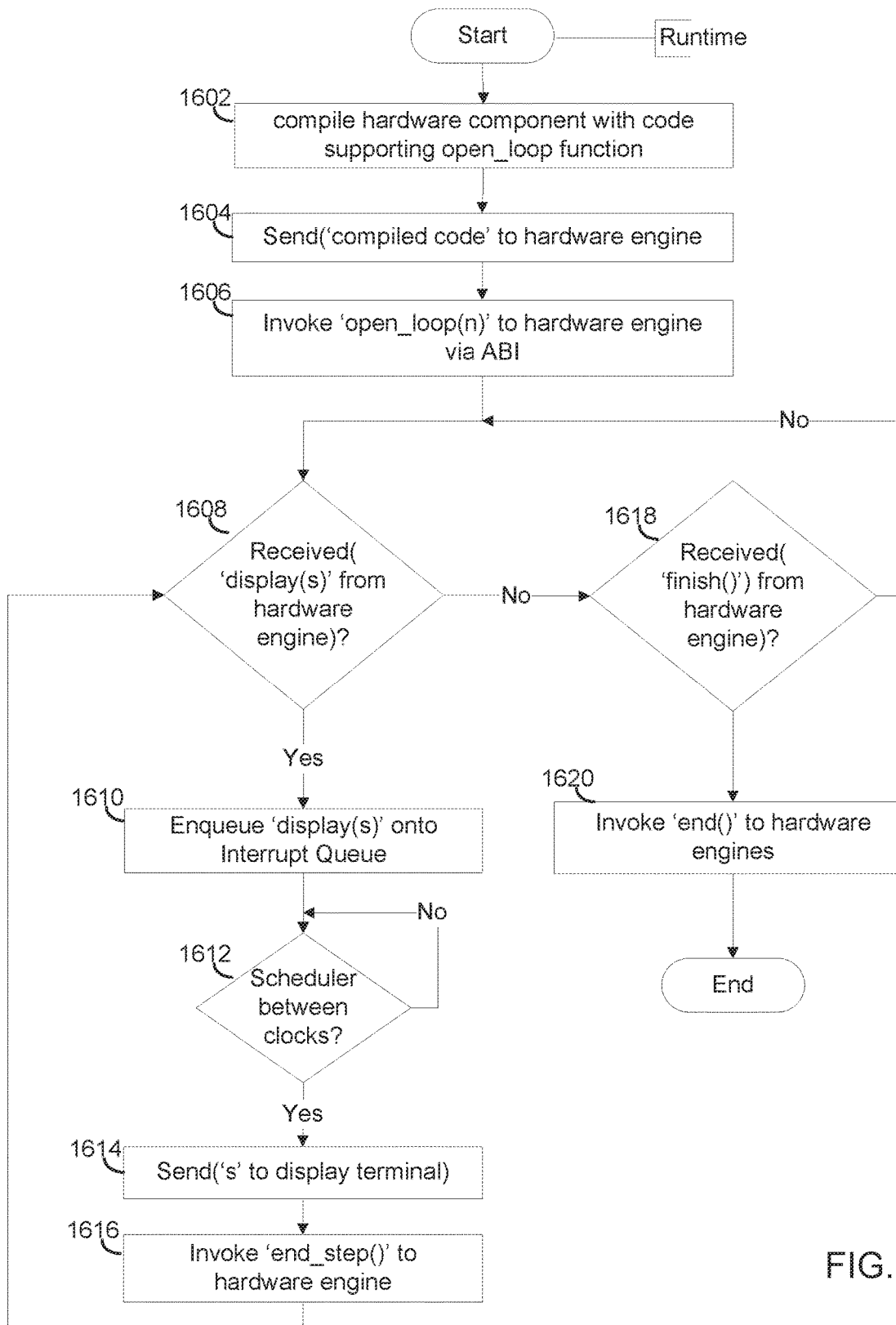
FIG. 16A depicts a flowchart of operations performed by the runtime system during an 'open_loop(n)' function, in an embodiment.

FIG. 16A depicts a flowchart of operations performed by the runtime system during an 'open_loop(n)' function, in an embodiment. In step 1602, runtime system 1102 compiles the hardware component with code (i.e., by adding code) that supports the 'open_loop(n)' function. In step 1604, runtime system 1102 sends/transfers the compiled code corresponding to the hardware component to an available hardware engine. In step 1606, runtime system 1102 invokes the 'open_loop(n)' function with a parameter n, specifying the number of steps in open loop operation of the hardware component in the hardware engine before the hardware component communicates with a component in a different hardware or software engine. In step 1608, runtime system 1102 receives a 'display(s)' function from the hardware engine (e.g., for displaying data values used in the hardware component). In step 1610, runtime system 1102 enqueues the 'display(s)' function onto interrupt queue 1106. In step 1612, runtime system 1102 determines whether scheduler 1136 is between clock ticks, which means that scheduler 1136 has finished all updates and evaluates and is able to handle interrupts (e.g., step 1366 in FIG. 13A). If so, then in step 1614, runtime system 1102 sends the string 's' specified in the 'display(s)' function to user terminal 416, where 'Send(item to destination)' uses an underlying communication mechanism, such as a mailbox, shared memory location, or high-speed serial link, to send the 'item' to the specified destination. In step 1616, runtime system 1102 invokes an 'end_step( )' function to the hardware engine indicating that the requested string 's' was displayed. In step 1618, runtime 1102 determines that a 'finish( )' function was invoked by the hardware engine. In step 1620, runtime 1102 invokes an 'end( )' function to all of the hardware engines, thereby stopping all of the hardware engines in response to the 'finish( )' function.

Figure 16B:
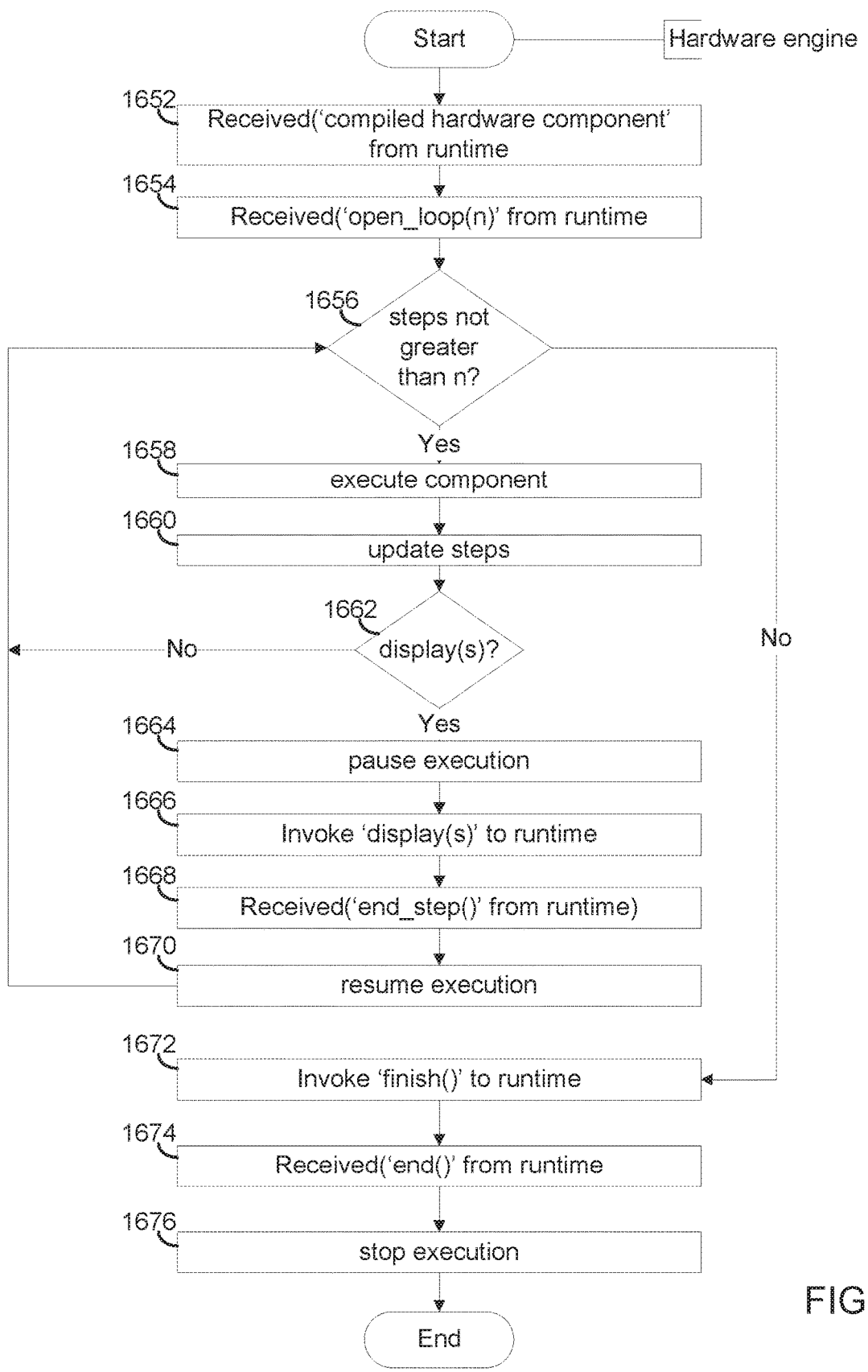
FIG. 16B depicts a flowchart of operations performed by a hardware engine during an 'open_loop(n)' function, in an embodiment.

FIG. 16B depicts a flowchart of operations performed by a hardware engine during an 'open_loop(n)' function, in an embodiment. In step 1652, the hardware engine receives a compiled hardware component from runtime system 1102 having code for the 'open_loop(n)' function. In step 1654, the hardware engine receives an invocation of the 'open_loop(n)' function via the ABI. In step 1656, the hardware engine determines whether the number of steps executed by the hardware engine is greater than the specified number n. If not, then in step 1658, the hardware engine executes the component and, in step 1660, updates the number of execution steps. In step 1662, the hardware engine determines whether it has encountered a 'display(s)' function in the engine code. If so, then in step 1664, the hardware engine pauses execution (e.g., after less than the specified number of steps), and in step 1666 invokes the 'display(s)' function by calling the function via the ABI to runtime system 1102. In step 1668, the hardware engine receives an 'end_step( )' function from runtime system 1102 indicating that the string 's' specified in the 'display(s)' function has been sent to user terminal 416. If, in step 1656, the hardware engine determines that the number of executed steps exceeds the specified number n, then the hardware engine, in an embodiment, invokes the 'finish( )' function to runtime system 1102. In step 1674, the hardware engine receives an 'end( )' function and, in step 1676, stops execution of the hardware engine in response to the 'end( )' function.

Figure 17A:
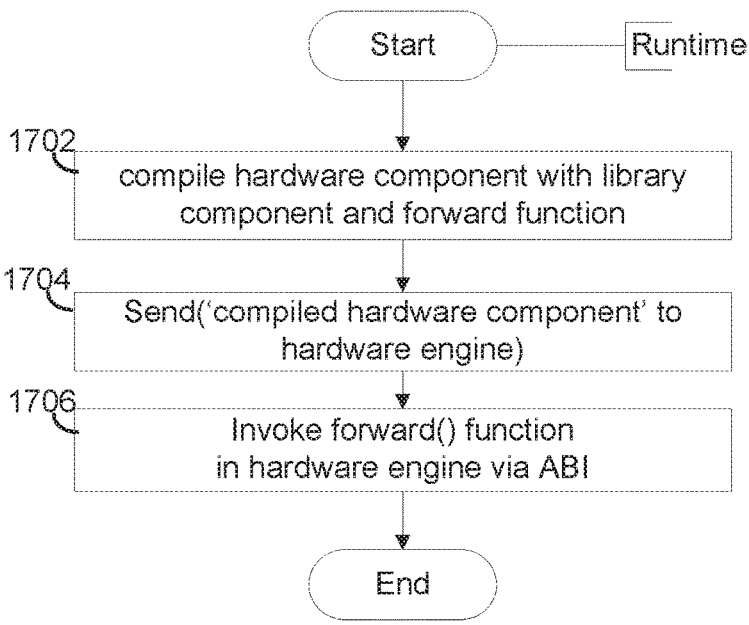
FIG. 17A depicts a flowchart of operations performed by the runtime system during a 'forward( )' function, in an embodiment.

FIG. 17A depicts a flowchart of operations performed by the runtime system during a 'forward( )' function, in an embodiment. In step 1702, runtime system 1102 compiles a hardware component with a standard library component and a 'forward( )' function. In step 1704, runtime system 1102 sends the compiled code to an available hardware engine. In step 1706, runtime system 1102 invokes the 'forward( )' function.

Figure 17B:
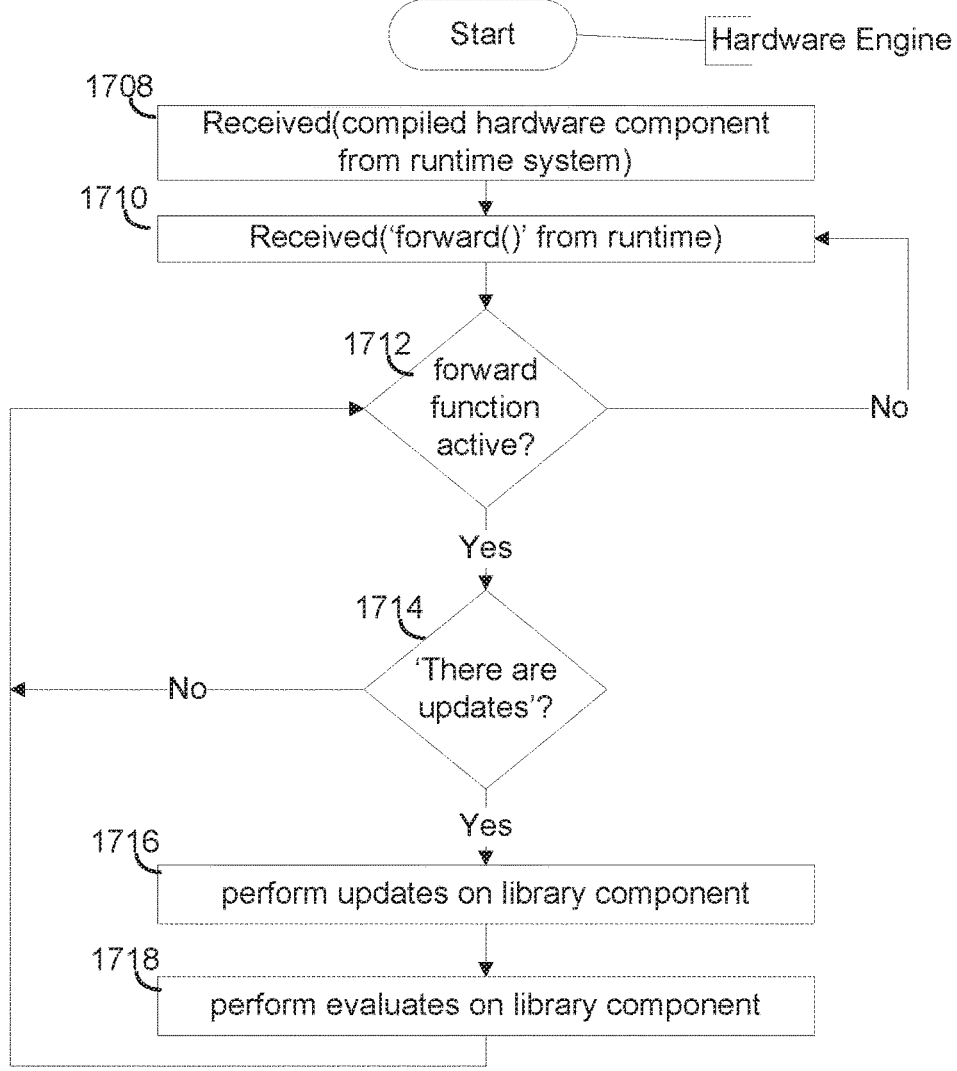
FIG. 17B depicts a flowchart of operations performed by a hardware engine during a 'forward( )' function, in an embodiment.

FIG. 17B depicts a flowchart of operations performed by a hardware engine during a 'forward( )' function, in an embodiment. In step 1708, the hardware engine receives a compiled component for execution. In step 1710, the hardware engine receives a 'forward( )' function from runtime system 1102. In step 1712, the hardware engine determines whether the 'forward( )' function is active and if so, then in step 1714 determines whether 'there_are_any_updates( )' is true for the standard library component. If so, then in step 1716 the hardware engine itself performs the updates on the standard library component and in step 1718, the hardware engine performs any needed evaluates on the standard library component caused by the updates.

Figure 18A:
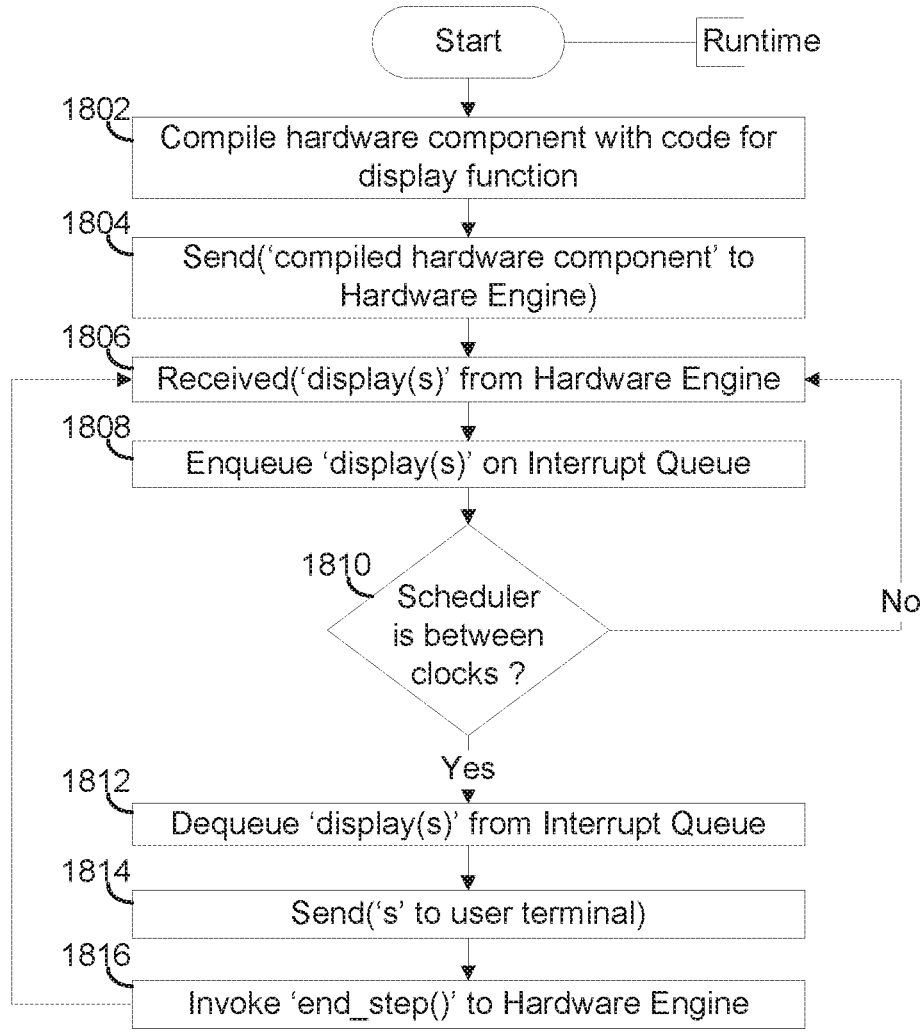
FIG. 18A depicts a flowchart of operations performed by the runtime system during a 'display(s)' function, in an embodiment.

FIG. 18A depicts a flowchart of operations performed by the runtime system during a 'display(s)' function, in an embodiment. In step 1802, runtime system 1102 compiles a hardware component with code for a 'display(s)' function. In step 1804, runtime system 1102 sends the compiled hardware component to an available hardware engine. In step 1806, runtime system 1102 receives a 'display(s)' function from the hardware engine. In step 1808, runtime system 1102 enqueues the 'display(s)' function on interrupt queue 1106. In step 1810, runtime system 1102 determines whether scheduler 1136 is between clock ticks. If so, then in step 1812, runtime system dequeues the 'display(s)' function from interrupt queue 1106 and in step 1814 sends the string 's' to user terminal 416. In step 1814, runtime 1102 invokes an 'end_step( )' function to the hardware engine and then returns to step 1806 to await another 'display(s)' function.

Figure 18B:
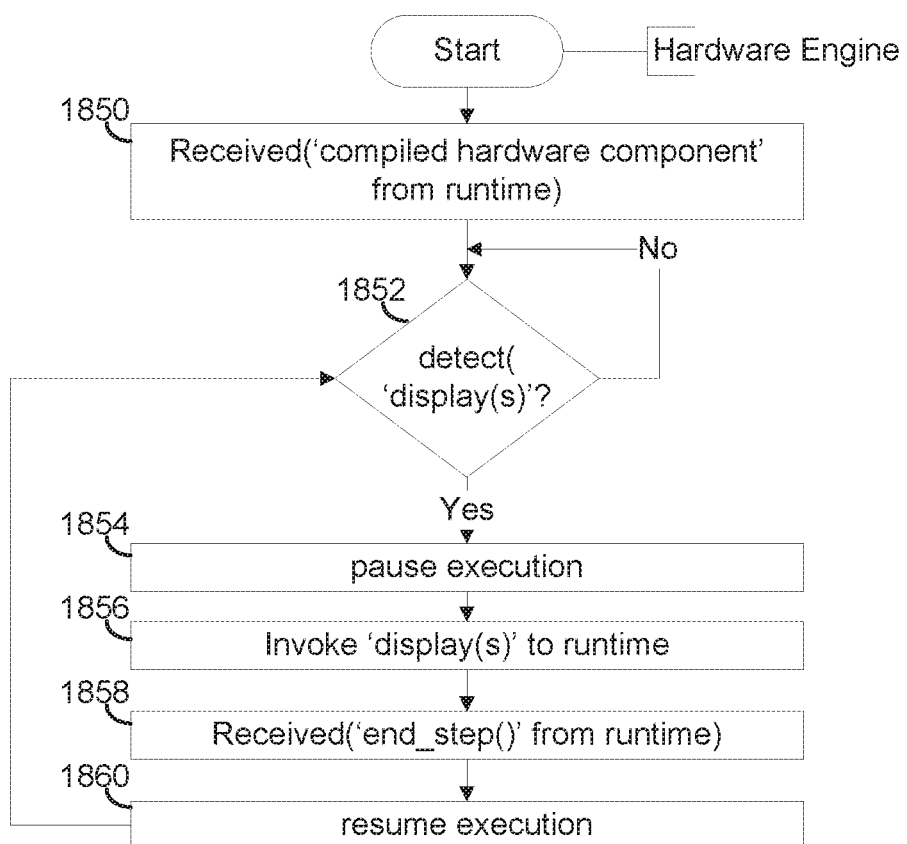
FIG. 18B depicts a flowchart of operations performed by a hardware engine during a 'display(s)' function, in an embodiment.

FIG. 18B depicts a flowchart of operations performed by a hardware engine during a 'display(s)' function, in an embodiment. In step 1850, the hardware engine receives a compiled hardware component from the runtime. In step 1852, the hardware engine determines if it has detected a 'display(s)' function in the code. If so, then in step 1854, the hardware engine pauses execution and in step 1865 invokes the 'display(s)' function to runtime system 1102. In step 1858, the hardware engine receives an 'end_step( )' function from runtime system 1102, and in step 1860, the hardware engine resumes execution.

In conclusion, in a design with a large number of components residing in hardware or software engines, each engine sends its outputs to many other engines and receives inputs from many other engines via the runtime system, as depicted in FIG. 12C. The communication via the runtime system can become an impediment to executing the design at high speed due to communication delays. The design of the scheduler in FIGS. 13A-C and the use of the 'open_loop (n)' function in the ABI cooperate to reduce the communication delays in running the hardware engines of the design so that the components in the hardware engines run at close to hardware speeds.

Certain embodiments as described above involve a hardware abstraction layer on top of a host computer. The hardware abstraction layer allows multiple contexts to share the hardware resource. In one embodiment, these contexts are isolated from each other, each having at least a user application running therein. The hardware abstraction layer thus provides benefits of resource isolation and allocation among the contexts. In the foregoing embodiments, virtual machines are used as an example for the contexts and hypervisors as an example for the hardware abstraction layer. As described above, each virtual machine includes a guest operation system in which at least one application runs. It should be noted that these embodiments may also apply to other examples of contexts, such as containers not including a guest operation system, referred to herein as "OS-less containers" (see, e.g., www.docker.com). OS-less containers implement operating system level virtualization, wherein an abstraction layer is provided on top of the kernel of an operating system on a host computer. The abstraction layer supports multiple OS-less containers each including an application and its dependencies. Each OS-less container runs as an isolated process in user space on the host operating system and shares the kernel with other containers. The OS-less container relies on the kernel's functionality to make use of resource isolation (CPU, memory, block I/O, network, etc.) and separate namespaces and to completely isolate the application's view of the operating environments. By using OS-less containers, resources can be isolated, services restricted, and processes provisioned to have a private view of the operating system with their own process ID space, file system structure, and network interfaces. Multiple containers can share the same kernel, but each container can be constrained to only use a defined amount of resources such as CPU, memory and I/O.

The various embodiments described herein may be practiced with other computer system configurations including hand-held devices, microprocessor systems, microprocessor-based or programmable consumer electronics, minicomputers, mainframe computers, and the like.

One or more embodiments of the present invention may be implemented as one or more computer programs or as one or more computer program modules embodied in one or more computer readable media. The term computer readable medium refers to any data storage device that can store data which can thereafter be input to a computer system. Computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a CD (Compact Discs)—CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

Although one or more embodiments of the present invention have been described in some detail for clarity of understanding, it will be apparent that certain changes and modifications may be made within the scope of the claims. Accordingly, the described embodiments are to be considered as illustrative and not restrictive, and the scope of the claims is not to be limited to details given herein, but may be modified within the scope and equivalents of the claims. In the claims, elements and/or steps do not imply any particular order of operation, unless explicitly stated in the claims.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the invention(s). In general, structures and functionality presented as separate components in exemplary configurations may be implemented as a combined structure or component. Similarly, structures and functionality presented as a single component may be implemented as separate components. These and other variations, modifications, additions, and improvements may fall within the scope of the appended claim(s).

What is claimed is:

1. A method for executing a hardware component of a design that includes a plurality of components executable in a plurality of software or hardware engines, the method comprising:
    compiling the hardware component to run in a hardware engine, wherein the compiling includes adding code to support an 'open_loop' function, and wherein invoking the 'open_loop' function requests that the hardware engine execute a plurality of steps before the hardware component communicates with a component in a different hardware or software engine;
    transferring the compiled hardware component to the hardware engine for execution under the control of a scheduler; and
    invoking the 'open_loop' function of the compiled hardware component at the hardware engine.

2. The method of claim 1, wherein the hardware engine with the compiled hardware component executes for all of the plurality of steps.

3. The method of claim 1,
    wherein the compiled hardware component includes a display function for displaying data values used in the compiled hardware component; and
    wherein the hardware engine with the compiled hardware component executes for less than all of the plurality of steps in order to execute the display function.

4. The method of claim 1,
    wherein operation of the compiled hardware component is specified in an intermediate representation of a hardware description language; and wherein compiling the hardware component includes adding code to the intermediate representation to support an interface that includes the 'open_loop' function.

5. The method of claim 4, wherein the interface is an application binary interface (ABI).

6. The method of claim 4, wherein the interface includes an end function that stops the compiled hardware component in the hardware engine.

7. The method of claim 1, wherein the compiled hardware component includes an additional interface for communicating with other components in the plurality of components.

8. The method of claim 7, wherein the additional interface is an advanced extensible interface (AXI).

9. A system for executing a hardware component of a design that includes a plurality of components, the system comprising:
one or more processors and a memory configured with: a plurality of hardware engines configured to execute one or more of the plurality of components, a plurality of software engines configured to execute one or more of the plurality of components, a scheduler configured to schedule interactions among the plurality of hardware engines and the plurality of software engines, and a runtime system configured to:
compile the hardware component to run in a hardware engine of the plurality of hardware engines, wherein the compiling includes adding code to support an 'open_loop' function and wherein invoking the 'open_loop' function requests that the hardware engine execute a plurality of steps before the hardware component communicates with a component in a different hardware or software engine;
transfer the compiled hardware component to the hardware engine for execution under the control of the scheduler; and
invoke the 'open_loop' function of the compiled hardware component at the hardware engine.

10. The system of claim 9, wherein the hardware engine with the compiled hardware component executes for all of the plurality of steps.

11. The system of claim 9,
wherein the compiled hardware component includes a display function for displaying data values used in the compiled hardware component; and
wherein the hardware engine with the compiled hardware component executes for less than all of the plurality of steps in order for the runtime system to execute the display function.

12. The system of claim 9,
wherein operation of the compiled hardware component is specified in an intermediate representation of a hardware description language; and
wherein compiling the hardware component includes adding code to the intermediate representation to support an interface that includes the 'open_loop' function.

13. The system of claim 12, wherein the interface is an application binary interface (ABI).

14. The system of claim 12, wherein the interface includes an end function that stops the compiled hardware component in the hardware engine.

15. The system of claim 9, wherein the compiled hardware component includes an additional interface for communicating with other components in the plurality of components.

16. The system of claim 15, wherein the additional interface is an application extensible interface (AXI).

17. A non-transitory computer readable storage medium storing instructions that, when executed by one or more processors, cause the one or more processors to perform a method for executing a hardware component of a design that includes a plurality of components, the method comprising:
compiling the hardware component to run in a hardware engine, wherein the compiling includes adding code to support an 'open_loop' function, and wherein invoking the 'open_loop' function requests that the hardware engine execute a plurality of steps before the hardware component communicates with a component in a different hardware or software engine;
transferring the compiled hardware component to the hardware engine for execution under the control of a scheduler; and
invoking the 'open_loop' function of the compiled hardware component at the hardware engine.

18. The non-transitory computer-readable storage medium of claim 17, wherein the hardware engine with the compiled hardware component executes for all of the plurality of steps.

19. The non-transitory computer-readable storage medium of claim 17,
wherein the compiled hardware component includes a display function for displaying data values used in the compiled hardware component; and
wherein the hardware engine with the compiled hardware component executes for less than all of the plurality of steps in order to execute the display function.

20. The non-transitory computer-readable storage medium of claim 17,
wherein operation of the compiled hardware component is specified in an intermediate representation of a hardware description language; and
wherein compiling the hardware component includes adding code to the intermediate representation to support an interface that includes the 'open_loop' function.

* * * * *